US012633928B2

(12) United States Patent
Shibayama

(10) Patent No.: US 12,633,928 B2
(45) Date of Patent: May 19, 2026

(54) CLOCK SIGNAL FREQUENCY DIVIDER, PROCESSING SYSTEM, PROCESSING DEVICE, AND CLOCK SIGNAL FREQUENCY DIVIDING METHOD

(71) Applicant: NEC Corporation, Tokyo (JP)

(72) Inventor: Atsufumi Shibayama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 309 days.

(21) Appl. No.: 18/419,673

(22) Filed: Jan. 23, 2024

(65) Prior Publication Data

US 2024/0275388 A1 Aug. 15, 2024

(30) Foreign Application Priority Data

Feb. 10, 2023 (JP) ................................. 2023-019438

(51) Int. Cl.
*H03K 21/00* (2006.01)
*H03K 23/64* (2006.01)

(52) U.S. Cl.
CPC ............. *H03K 21/00* (2013.01); *H03K 23/64* (2013.01)

(58) Field of Classification Search
CPC ........ H03K 21/00; H03K 21/02; H03K 21/08; H03K 23/64
USPC .......................... 327/115, 117, 291, 295, 297
See application file for complete search history.

(56) References Cited

U.S. PATENT DOCUMENTS 10,775,831 B1 * 9/2020 Kamiya ................ G06F 1/3296
2003/0020529 A1 * 1/2003 Nakanishi ............ H03K 5/1506
327/295

2008/0061855 A1 * 3/2008 Cha .......................... H03K 3/84
327/117
2011/0187418 A1 * 8/2011 Shibayama .......... H03K 23/662
327/115
2011/0193596 A1 * 8/2011 Shibayama .......... H03K 23/662
327/115
2011/0200162 A1 * 8/2011 Shibayama .......... H03K 5/1506
377/48
2011/0222644 A1 * 9/2011 Shibayama .......... H03K 23/662
327/115
2019/0086949 A1 * 3/2019 Kamiya .................. G06F 1/025

FOREIGN PATENT DOCUMENTS

JP 2005-045507 A 2/2005
JP 2006-148807 A 6/2006
WO 2009/116398 A1 9/2009

* cited by examiner

*Primary Examiner* — William Hernandez
(74) *Attorney, Agent, or Firm* — Sughrue Mion, PLLC

(57) ABSTRACT

A clock signal frequency divider according to one aspect of the present disclosure includes: an output signal generation circuit configured to generate, from pulses of a received input clock signal, an output clock signal including a repetition of a periodic pattern signal in which a pulse of a mask pulse number is masked among consecutive pulses of a periodic pulse number, the periodic pattern signal including a marker portion including at least one unmasked pulse at a start portion of the periodic pattern signal; and an output circuit configured to output the output clock signal, wherein the output signal generation circuit generates the periodic pattern signal in such a way that a pattern of a timing of the at least one unmasked pulse of the marker portion does not appear in a portion other than a portion corresponding to the marker portion in the output clock signal.

11 Claims, 18 Drawing Sheets

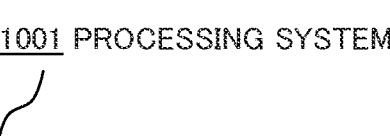

1001 PROCESSING SYSTEM

FREQUENCY
DIVISION RATIO
SETTING A

COMMUNICATION
TIMING
CLOCK S    INFORMATION    CLOCK S

FREQUENCY
DIVISION RATIO
SETTING B

1010A

CLOCK
SIGNAL
FREQUENCY
DIVIDER

1010B

CLOCK
SIGNAL
FREQUENCY
DIVIDER

CLOCK A

CLOCK B

PROCESSING
DEVICE

PROCESSING
DEVICE

2000A

2000B

FREQUENCY DIVISION
RATIO SETTING A
FREQUENCY DIVISION
RATIO SETTING B

FREQUENCY DIVISION
RATIO SETTING A
FREQUENCY DIVISION
RATIO SETTING B

FREQUENCY DIVISION
RATIO SETTING

CLOCK S

COMMUNICATION
TIMING
INFORMATION

1010

1011
CLOCK SIGNAL
RECEPTION
UNIT

1012
SETTING
INFORMATION
RECEPTION
UNIT

1013
OUTPUT
SIGNAL
GENERATION
UNIT

1014
OUTPUT
UNIT

CLOCK SIGNAL
FREQUENCY DIVIDER

OUTPUT CLOCK SIGNAL

Fig.14

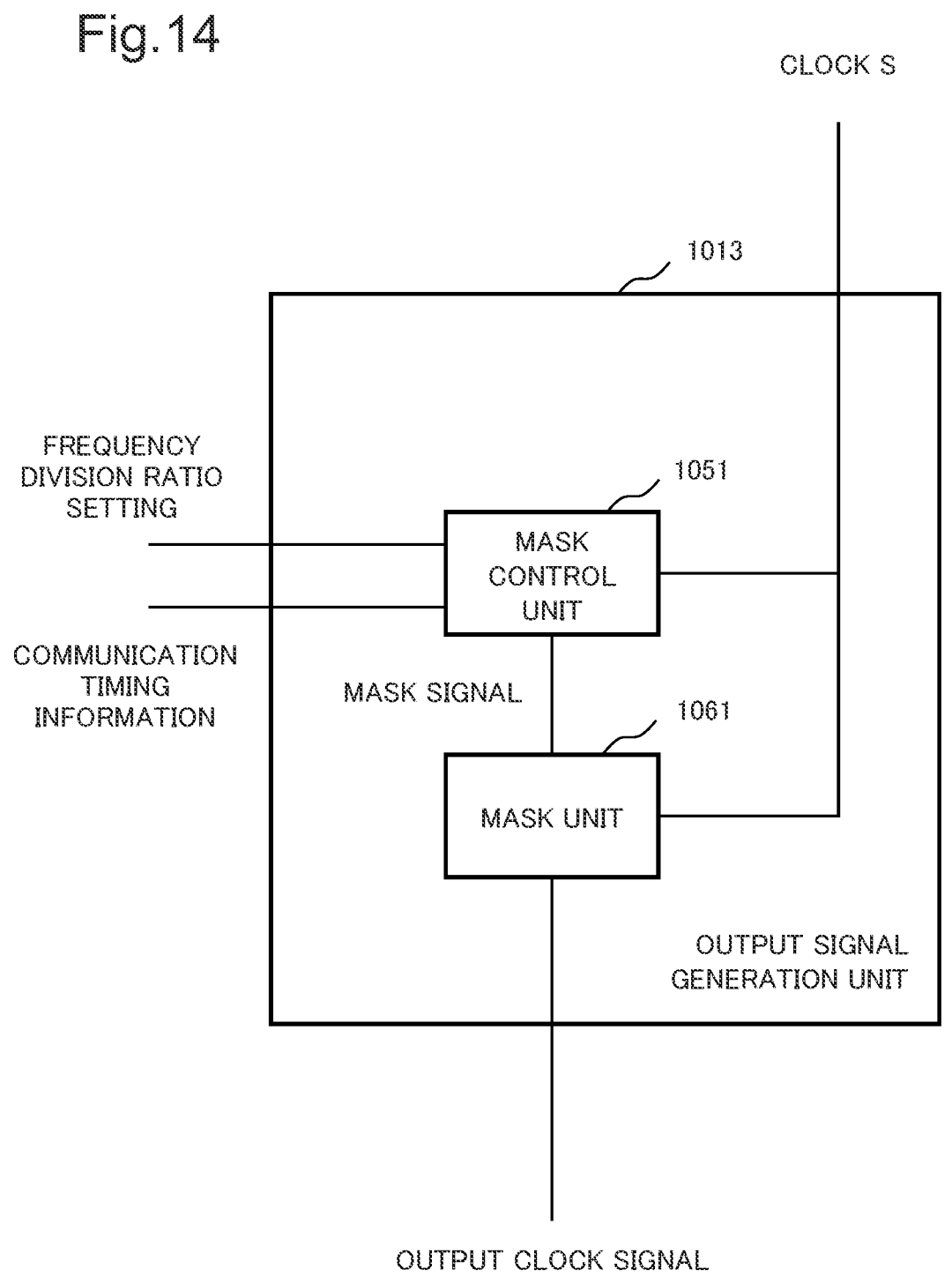

CLOCK S

1013

FREQUENCY
DIVISION RATIO
SETTING

1051

MASK
CONTROL
UNIT

COMMUNICATION
TIMING
INFORMATION

MASK SIGNAL

1061

MASK UNIT

OUTPUT SIGNAL
GENERATION UNIT

OUTPUT CLOCK SIGNAL

CLOCK SIGNAL FREQUENCY DIVIDER, PROCESSING SYSTEM, PROCESSING DEVICE, AND CLOCK SIGNAL FREQUENCY DIVIDING METHOD

This application is based upon and claims the benefit of priority from Japanese Patent Application No. 2023-019438, filed on Feb. 10, 2023, the disclosure of which is incorporated herein in its entirety by reference.

TECHNICAL FIELD

The present disclosure relates to a technology for generating a clock signal.

BACKGROUND ART

The optimum operating frequency of a circuit block is determined from the viewpoint of a circuit scale or power consumption according to a content of signal processing performed by the circuit block. Therefore, in a digital signal processing circuit including a plurality of circuit blocks, the optimum operating frequencies of the plurality of circuit blocks are not necessarily the same.

As a method of flexibly providing a clock signal of the optimum frequency for each circuit block, there is a method of generating a clock signal of a lower frequency by frequency-dividing a clock signal of a certain frequency.

In a clock signal frequency dividing circuit that generates a clock signal of a lower frequency by frequency-dividing a clock signal of a certain frequency, a ratio between the frequency of the clock signal before the frequency division and the frequency of the clock signal after the frequency division is referred to as a frequency division ratio. A frequency dividing circuit (integer frequency dividing circuit) having a frequency division ratio of 1/M (M is an integer) can be easily implemented by using a counter circuit.

In addition, frequency division with a frequency division ratio of N/M (N and M are integers) is expressed as rational number frequency division. A frequency dividing circuit capable of performing frequency division even with the frequency division ratio of N/M (N and M are integers) is called a rational number frequency dividing circuit. Examples of such a rational number frequency divider circuit are disclosed in JP 2005-45507 A and JP 2006-148807 A.

In the technologies disclosed in JP 2005-45507 A and JP 2006-148807 A, a value for setting the numerator of the frequency division ratio (that is, the value of N in the frequency division ratio N/M) is cumulatively added every cycle of an input clock signal. Then, in a case where the addition result is larger than a value for setting the denominator of the frequency division ratio (that is, the value of M in the frequency division ratio N/M), an operation of subtracting M from the addition result is performed. Then, the rational number frequency division is implemented by appropriately masking (that is, thinning out) a clock pulse of the input clock signal with reference to the addition result.

Clock signal frequency dividing circuits described in JP 2005-45507 A and JP 2006-148807 A each selectively masks and frequency-divides the clock pulse of the input clock signal to generate an output clock signal. However, in these clock signal frequency dividing circuits, a communication timing of a counterpart circuit that performs data communication with a target circuit using the output clock signal is not considered. Therefore, in a case where the target circuit performs data communication with the counterpart circuit that operates with a clock signal of a frequency different from that of the input clock signal, a special clock transfer circuit or a special timing design is required. As a result, there is a problem that communication performance is deteriorated, and power consumption, the circuit scale, and a design cost are increased.

In response to such a problem, WO 2009/116398 A1 discloses a clock signal frequency dividing circuit or the like that generates an output clock signal for performing data communication with a counterpart circuit operating with a clock signal having a frequency different from that of an input clock signal without deteriorating communication performance.

The clock signal frequency dividing circuit described in WO 2009/116398 A1 generates the output clock signal based on a frequency division ratio defined by N/M (N is a positive integer, and M is a positive integer greater than N). Specifically, the clock signal frequency dividing circuit generates the output clock signal obtained by frequency-dividing the input clock signal with the frequency division ratio of N/M by masking M-N clock pulses among M consecutive clock pulses of the input clock signal. More specifically, the clock signal frequency dividing circuit described in WO 2009/116398 A1 includes a mask circuit and a mask control circuit. The mask circuit generates and outputs the output clock signal by masking the clock pulse of the input clock signal according to an input mask signal. The mask control circuit generates a mask signal in which mask timings for masking M-N clock pulses are allocated to timings other than a communication timing among timings of M consecutive clock pulses of the input clock signal. The communication timing is a timing of data communication performed by a target circuit using the output clock signal. Information regarding the communication timing is given to the mask control circuit. The mask control circuit outputs the generated mask signal to the mask circuit.

Therefore, in the clock signal frequency dividing circuit described in WO 2009/116398 A1, the clock pulse of the input clock signal is output as the output clock signal without being masked at the communication timing of the target circuit. Therefore, it is possible to generate an output clock signal for performing data communication with a counterpart circuit operating with a clock signal different from the input clock signal without deteriorating communication performance.

SUMMARY

An object of the present disclosure is to provide a clock signal frequency divider or the like capable of reducing costs and facilitating timing design.

A clock signal frequency divider according to an aspect of the present disclosure includes: an output signal generation circuit configured to generate, from pulses of a received input clock signal, an output clock signal including a repetition of a periodic pattern signal in which a pulse of a mask pulse number is masked among consecutive pulses of a periodic pulse number, the periodic pattern signal including a marker portion including at least one unmasked pulse at a start portion of the periodic pattern signal, the mask pulse number being smaller than the periodic pulse number; and an output circuit configured to output the output clock signal, wherein the output signal generation circuit generates the periodic pattern signal in such a way that a pattern of a timing of the at least one unmasked pulse of the marker portion does not appear in a portion other than a portion corresponding to the marker portion in the output clock signal.

A processing device according to an aspect of the present disclosure includes: a clock signal reception circuit configured to receive a first clock signal, the first clock signal being a clock signal including a repetition of a periodic pattern signal in which a predetermined pulse of the mask pulse number is masked among consecutive pulses of a periodic pulse number the periodic pattern signal including a marker portion including at least one unmasked pulse at a start portion of the periodic pattern signal, the mask pulse number being smaller than the periodic pulse number, the periodic pattern signal being a clock signal in which a pattern of a timing of the at least one unmasked pulse of the marker portion does not appear in a portion other than a portion corresponding to the marker portion in the clock signal; a start specifying circuit configured to specify a start clock timing of the marker portion of the received first clock signal based on information regarding the marker portion in a case where the mask pulse number is equal to the mask pulse number of the first clock signal, the start clock timing being a first timing among timings at which the pulses are output as the clock signals in a case where the pulses are not masked; a clock information reception circuit configured to receive information regarding the mask pulse number of a second clock signal which is the clock signal whose mask pulse number is different from the mask pulse number of the first clock signal; a matching timing specifying circuit configured to specify a matching timing at which a timing of the unmasked pulse of the first clock signal and a timing of the unmasked pulse of the second clock signal match each other from the start clock timing, a pattern of the timing of the unmasked pulse of the first clock signal, and a pattern of the timing of the unmasked pulse of the clock signal in a case where the mask pulse number is equal to the mask pulse number of the second clock signal; and a communication circuit configured to communicate, at the specified matching timing, with a second information processing device to which the second clock signal is supplied.

A clock signal frequency dividing method according to an aspect of the present disclosure includes: generating, from pulses of a received input clock signal, an output clock signal including a repetition of a periodic pattern signal in which a pulse of a mask pulse number is masked among consecutive pulses of a periodic pulse number, the periodic pattern signal including a marker portion including at least one unmasked pulse at a start portion of the periodic pattern signal, the mask pulse number being smaller than the periodic pulse number; and outputting the output clock signal, wherein in the generating of the output clock signal, the periodic pattern signal is generated in such a way that a pattern of a timing of the at least one unmasked pulse of the marker portion does not appear in a portion other than a portion corresponding to the marker portion in the output clock signal.

BRIEF DESCRIPTION OF THE DRAWINGS

Exemplary features and advantages of the present invention will become apparent from the following detailed description when taken with the accompanying drawings in which:

FIG. 10 is a diagram illustrating an example of a circuit including a clock signal frequency dividing circuit according to a second comparative example of the present disclosure;

FIG. 12 is a diagram schematically illustrating an example of a configuration of a processing system according to the second example embodiment of the present disclosure;

FIG. 14 is a diagram illustrating an example of a configuration of an output signal generation unit according to a schematic example of the second example embodiment of the present disclosure;

EXAMPLE EMBODIMENT

Comparative examples of the present disclosure will be described in detail with reference to the drawings before describing example embodiments of the present disclosure.

First Comparative Example

First, a first comparative example will be described. The first comparative example is an example of a clock signal frequency dividing circuit based on the technologies described in JP 2005-45507 A and JP 2006-148807 A described above.

Figure 8:
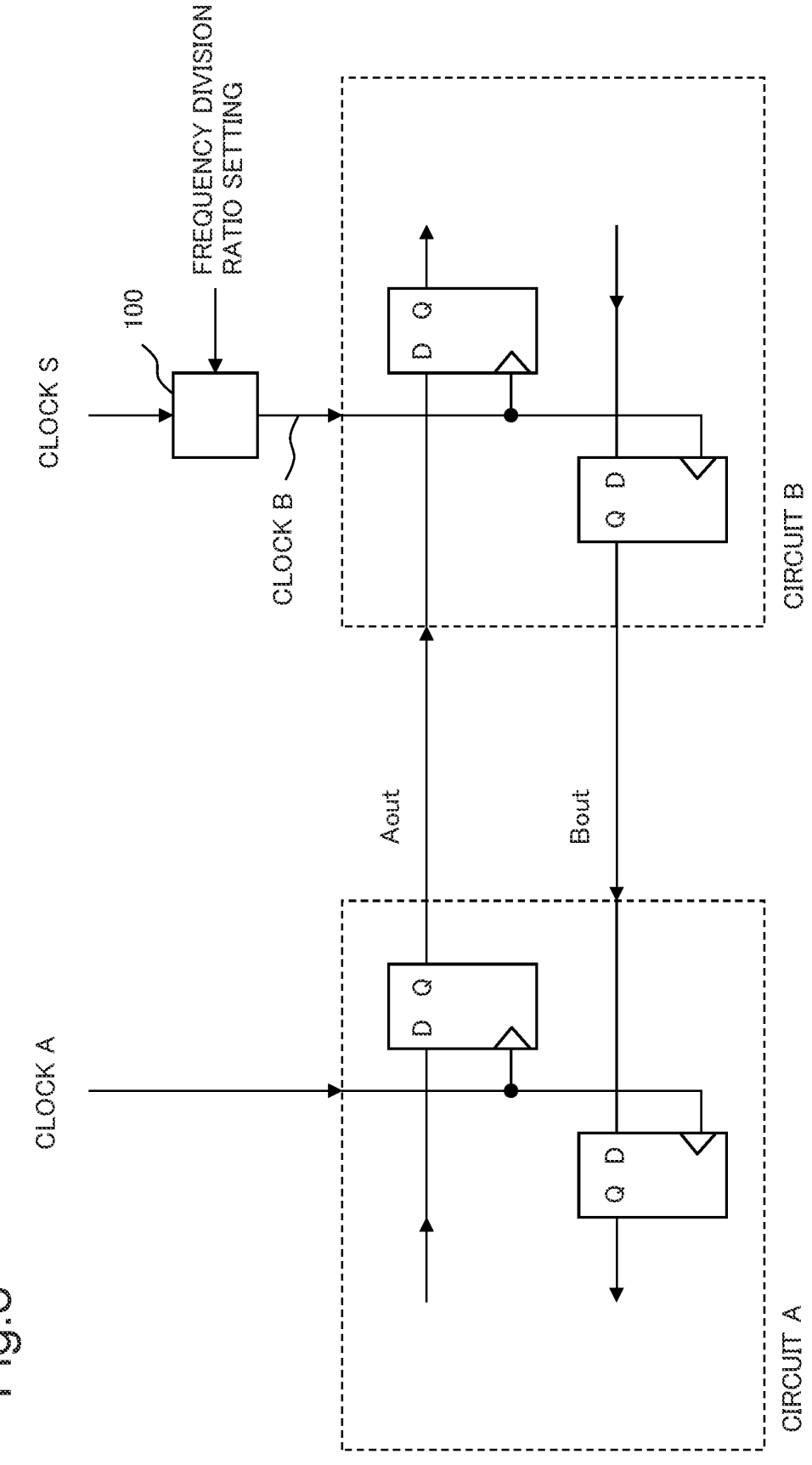
FIG. 8 is a diagram illustrating an example of a circuit including a clock signal frequency dividing circuit according to a first comparative example of the present disclosure.

FIG. 8 is a diagram illustrating an example of a circuit including the clock signal frequency dividing circuit according to the first comparative example of the present disclosure.

Figure 9:
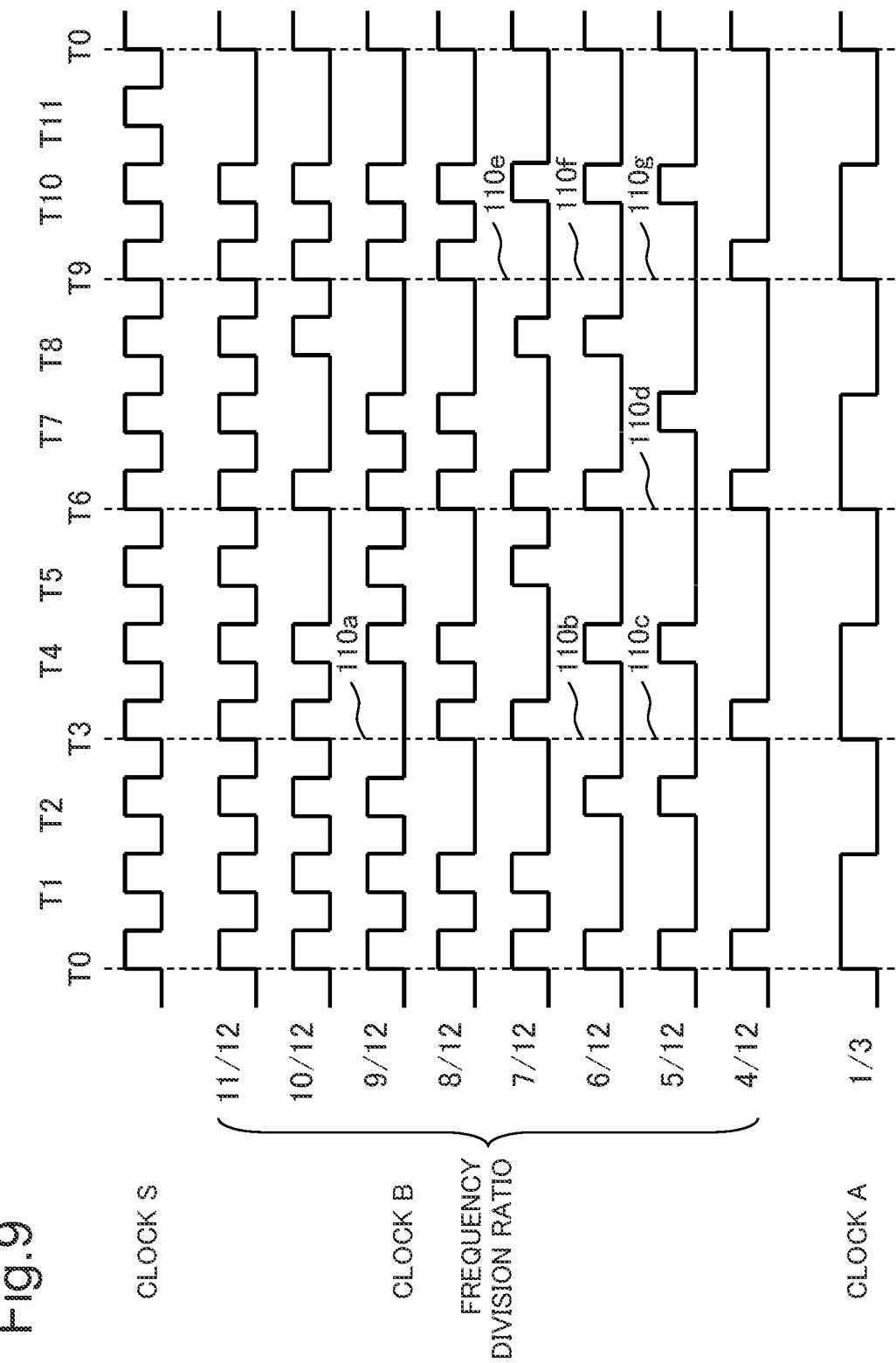
FIG. 9 is a diagram illustrating a timing of a clock signal output from the clock signal frequency dividing circuit according to the first comparative example of the present disclosure.

FIG. 9 is a diagram illustrating a timing of a clock signal output from the clock signal frequency dividing circuit according to the first comparative example of the present disclosure.

In the example illustrated in FIG. 8, the circuit includes a clock signal frequency dividing circuit 100, a circuit A, and a circuit B. A clock signal (denoted as clock S) is supplied to the clock signal frequency dividing circuit 100. A frequency division ratio setting (for example, a signal representing the above-described frequency division ratio N/M) is input to the clock signal frequency dividing circuit 100. The clock signal frequency dividing circuit 100 generates a clock signal (denoted as clock B) by performing rational number frequency division on the clock S according to the input frequency division ratio setting. The clock signal frequency dividing circuit 100 supplies the clock B to the circuit B. A clock signal (denoted as clock A) different from the clock B is supplied to the circuit A. The circuit B is a circuit (referred to as a target circuit) to which the clock signal frequency dividing circuit 100 supplies a clock. The circuit A is a circuit (referred to as a counterpart circuit) that communicates with the target circuit. The circuit A and the circuit B communicate with each other via a signal Aout and a signal Bout. The signal Aout is a signal output by the circuit A at a timing of the clock A and input to the circuit B at a timing of the clock B. The signal Bout is a signal output by the circuit B at the timing of the clock B and input to the circuit A at the timing of the clock A.

FIG. 9 illustrates the clock B generated by frequency-dividing the clock S with a frequency division ratio of 11/12 to 4/12, together with the clock S and the clock A. In FIG. 9, the horizontal direction represents the passage of time. That is, in FIG. 9, pulses (that is, pulses whose rising edges are represented by line segments included in the same vertical line) with the same horizontal position represent clock pulses at the same timing. The clock B can be generated by appropriately masking a clock pulse of the input clock S. For example, the clock B of the frequency division ratio of 9/12 is generated by masking three clock pulses at timings T3, T8, and T11 among 12 clock pulses at timings T0 to T11 of the clock S.

Here, it is assumed that a frequency of the clock A is ⅓ of a frequency of the clock S. That is, the frequency division ratio of the clock A to the clock S is ⅓ (=4/12). At this time, a phase relationship between the clock A and the clock B completes one cycle in 12 cycles of the clock S. In FIG. 9, the timings of 12 cycles in which the phase relationship completes one cycle are indicated by T0 to T11. It is assumed that the circuit A and the circuit B communicate with each other at the timings T0, T3, T6, and T9, which are timings of all the rising edges of the clock A. That is, the circuit A outputs the signal Aout at the timings T0, T3, T6, and T9, which are the timings of the rising edges of the clock A and the timings of the communication. In addition, the signal Bout is input to the circuit A at the same timing.

However, in the clock signal frequency dividing circuit 100 of this comparative example, communication with a clock with a different frequency is not considered. Therefore, the clock signal frequency dividing circuit 100 may generate the clock B in which the clock pulse of the clock S is masked at these timings. In the example illustrated in FIG. 9, the clock signal frequency dividing circuit 100 may generate the clock B in which the clock pulse of the clock S is masked at T3, T6, and T9 among the communication timings.

Specifically, the clock pulses of the clock B (timing 110*a*) in a case where the frequency division ratio is 9/12, the clock B (timing 110*b*) in a case where the frequency division ratio is 6/12, and the clock B (timing 110*c*) in a case where the frequency division ratio is 5/12 are masked at the timing T3. In the example of FIG. 9, a timing associated to the timing T3 in the waveform of the clock B in a case where the frequency division ratio is 9/12 is the timing 110*a*. A timing associated to the timing T3 in the waveform of the clock B in a case where the frequency division ratio is 6/12 is the timing 110*b*. A timing associated to the timing T3 in the waveform of the clock B in a case where the frequency division ratio is 5/12 is the timing 110*c*.

Similarly, the clock pulse of the clock B (timing 110*d*) in a case where the frequency division ratio is 5/12 is masked at the timing T6. A timing associated to the timing T6 in the waveform of the clock B in a case where the frequency division ratio is 5/12 is the timing 110*d*.

Similarly, the clock pulses of the clock B (timing 110*e*) in a case where the frequency division ratio is 7/12, the clock B (timing 110*f*) in a case where the frequency division ratio is 6/12, and the clock B (timing 110*g*) in a case where the frequency division ratio is 5/12 are masked at the timing T9. A timing associated to the timing T9 in the waveform of the clock B in a case where the frequency division ratio is 7/12 is the timing 110*e*. A timing associated to the timing T9 in the waveform of the clock B in a case where the frequency division ratio is 6/12 is the timing 110*f*. A timing associated to the timing T9 in the waveform of the clock B in a case where the frequency division ratio is 5/12 is the timing 110*g*.

As in these cases, in a case where the clock B in which the communication timing clock pulse of the clock S is masked is generated, the signal Aout output from the circuit A operating with the clock A is not input to the circuit B operating with the clock B at an expected timing. In other words, in such a case, a timing at which the circuit A outputs the signal Aout is not a timing at which the circuit B can receive the signal Aout. Similarly, in such a case, the circuit B operating with the clock B cannot output the signal Bout at a timing at which the input of the signal Bout is expected in the circuit A operating with the clock A. In other words, in such a case, the circuit B cannot output the signal Bout at a timing at which the signal Bout can be input to the circuit A.

Therefore, in the clock signal frequency dividing circuit of this comparative example, a special clock transfer circuit or a special timing design is required in order to implement an expected correct communication operation in communication with a clock of a different frequency. As a result, there arises a problem that communication performance is deteriorated, and power consumption, the circuit scale, and a design cost are increased.

Second Comparative Example

Next, a second comparative example will be described. The second comparative example is an example of a clock signal frequency dividing circuit based on the technology described in WO 2009/116398 A1 described above.

Figure 10:
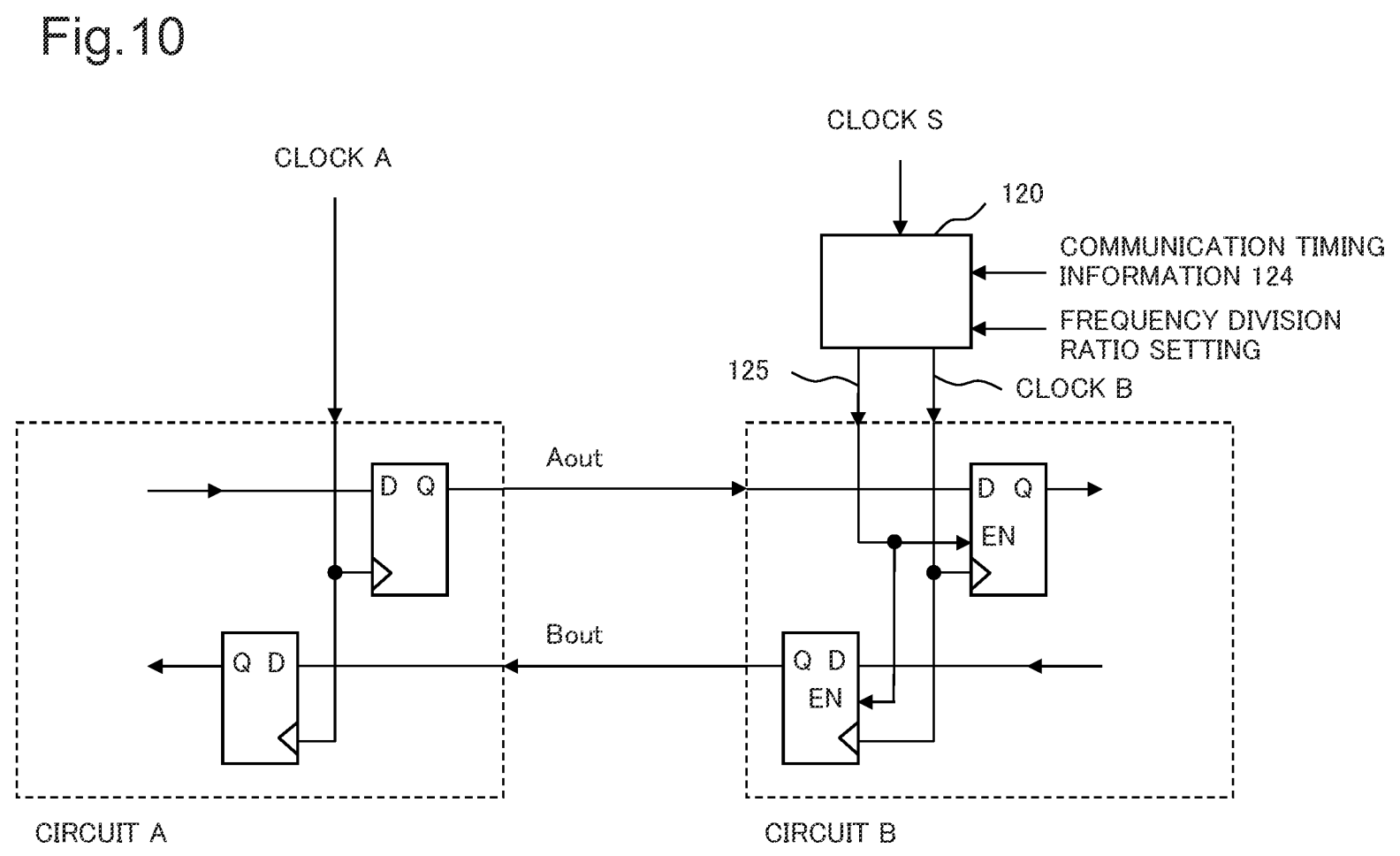

FIG. 10 is a diagram illustrating an example of a circuit including the clock signal frequency dividing circuit according to the second comparative example of the present disclosure.

Figure 11:
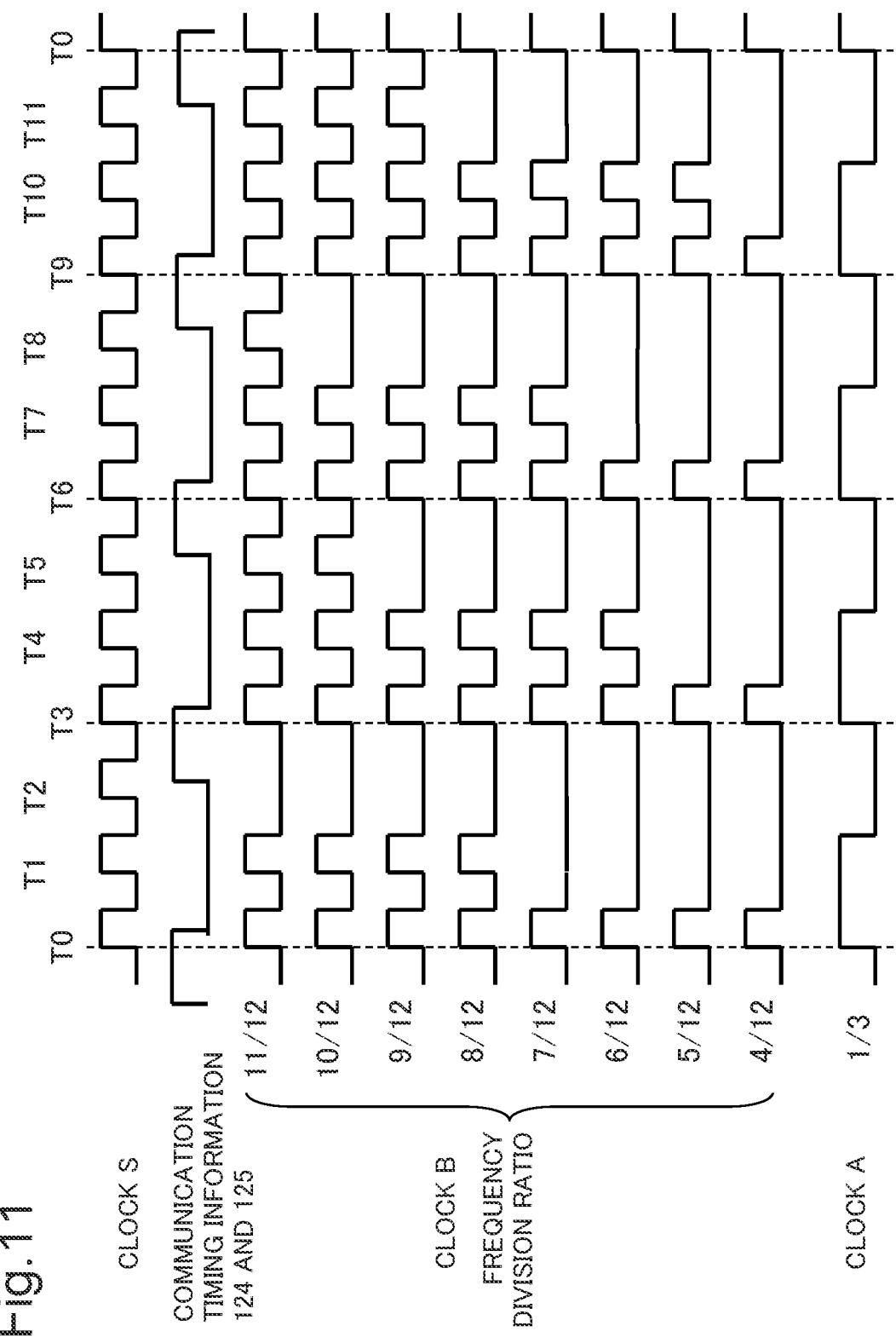
FIG. 11 is a diagram illustrating a timing of a clock signal output from the clock signal frequency dividing circuit according to the second comparative example of the present disclosure.

FIG. 11 is a diagram illustrating a timing of a clock signal output from the clock signal frequency dividing circuit according to the second comparative example of the present disclosure.

The example of the circuit illustrated in FIG. 10 includes a circuit A operating with a clock A, a circuit B operating with a clock B, and a clock signal frequency dividing circuit 120.

In addition to a frequency division ratio setting, communication timing information 124 which is a signal indicating a timing of communication between the circuit A operating with the clock A and the circuit B operating with the clock B is input to the clock signal frequency dividing circuit 120. Furthermore, a clock S is supplied to the clock signal frequency dividing circuit 120. The clock signal frequency dividing circuit 120 generates the clock B by performing rational number frequency division on the clock S according to the frequency division ratio setting and the communication timing information 124. In other words, the clock signal frequency dividing circuit 120 generates the clock B by masking some clock pulses of the clock S in such a way that a clock pulse at the communication timing indicated by the communication timing information 124 is not masked, with a frequency division ratio according to the frequency division ratio setting. The clock signal frequency dividing circuit 120 supplies the generated clock B to the circuit B.

The clock A is supplied to the circuit A. The clock B different from the clock A is supplied to the circuit B. Similarly to the first comparative example, the circuit B is a circuit (referred to as a target circuit) to which the clock signal frequency dividing circuit 100 supplies a clock. The circuit A is a circuit (referred to as a counterpart circuit) that communicates with the target circuit.

The circuit A and the circuit B communicate with each other via a signal Aout and a signal Bout at the communication timing described above. The signal Aout is a signal output by the circuit A at a timing of the clock A and input to the circuit B at a timing of the clock B. The signal Bout is a signal output by the circuit B at the timing of the clock B and input to the circuit A at the timing of the clock A.

FIG. 11 illustrates the clock B generated by the clock signal frequency dividing circuit 120 according to the present modified example frequency-dividing the clock S with the frequency division ratio of 11/12 to 4/12, together with the clock S, the clock A, the communication timing information 124, and communication timing information 125. In the example of FIG. 11, the communication timing information 124 and the communication timing information 125 are signals having the same waveform. In FIG. 11, the horizontal direction represents the passage of time. That is, in FIG. 11, pulses (that is, pulses whose rising edges are represented by line segments included in the same vertical line) with the same horizontal position represent clock pulses at the same timing.

The clock signal frequency dividing circuit 120 generates the clock B by masking the clock pulse of the input clock S with the frequency division ratio indicated by the frequency division ratio setting in such a way as not to mask the pulse at the communication timing.

For example, the clock B in a case where the frequency division ratio is 9/12 is generated by masking three clock pulses at timings T2, T5, and T8 among 12 clock pulses at timings T0 to T11 of the clock S.

Similarly to the first comparative example, it is assumed that the frequency of the clock A is ⅓ of the frequency of the clock S. That is, the frequency division ratio of the clock A to the clock S is ⅓ (=4/12). At this time, a phase relationship between the clock A and the clock B completes one cycle in 12 cycles of the clock S. The timings of 12 cycles in which the phase relationship completes one cycle are indicated by the timings T0 to T11. In this comparative example, the circuit A and the circuit B communicate with each other at the timings T0, T3, T6, and T9, which are timings of all the rising edges of the clock A. That is, the circuit A outputs the signal Aout at the timings T0, T3, T6, and T9, which are the timings of the rising edges of the clock A and the timings of the communication. In addition, the signal Bout is input to the circuit A at the timings T0, T3, T6, and T9.

The clock signal frequency dividing circuit 120 receives the input communication timing information 124 indicating the above-described communication timing, and performs rational number frequency division in consideration of the communication timing indicated by the received communication timing information 124. Specifically, the clock signal frequency dividing circuit 120 does not always mask the clock pulse at the communication timing indicated by the communication timing information 124. Then, the clock signal frequency dividing circuit 120 implements rational number frequency division by masking the clock pulse that is not at the communication timing to have the frequency division ratio indicated by the frequency division ratio setting. The clock pulse that is not at the communication timing is a clock pulse other than the clock pulse at the communication timing indicated by the communication timing information 124.

In the example of FIG. 11, the clock pulse is not always masked at the timings T0, T3, T6, and T9 which are the communication timings. The clock signal frequency dividing circuit 120 generates the clock B by masking the clock pulse at any of the timings T1, T2, T4, T5, T7, T8, T10, and T11, which are not the communication timings, other than the timings T0, T3, T6, and T9. The clock B generated by the clock signal frequency dividing circuit 120 always has a clock pulse at the communication timing. Therefore, the circuit B operating with the clock B can always receive the signal Aout output from the circuit A operating with the clock A at an expected timing. In other words, the circuit A always outputs the signal Aout at a timing at which the circuit B can receive the signal Aout. Similarly, the circuit B operating with the clock B can always output the signal Bout to the circuit A operating with the clock A at an expected timing. In other words, the circuit B always outputs the signal Bout at a timing at which the circuit A can receive the signal Bout.

The clock B has a clock pulse at a timing other than the communication timing. Therefore, in order for the circuit B to perform communication only at a communication timing at which the circuit A can receive the signal Bout, the circuit B needs to output the signal Bout only at the communication timing. Therefore, the clock signal frequency dividing circuit 120 outputs the communication timing information 125 indicating the above-described communication timing to the circuit B.

Here, the communication timing information 125 needs to be a signal synchronized with the clock B. In other words, in a case where a timing at which the clock B is distributed to the circuit B is different from a timing at which the signal of the communication timing information 125 propagates to the circuit B, the circuit B cannot receive the communication timing information. Therefore, it is necessary to match the distribution timing of the clock B with the propagation timing of the communication timing information 125. Since the clock signal is distributed to a large number of flip-flops, a distribution delay is usually very large. Furthermore, when the circuit of the present modified example is implemented as a semiconductor integrated circuit, a delay time of a propagation delay of the communication timing information 125 and a delay time of the distribution delay of the clock B also vary due to variations in semiconductor processes, temperatures, voltages, and the like. However, it is necessary to adjust the propagation delay of the communication timing information 125 to be equivalent to the distribution delay of the clock B. Therefore, timing design when implementing the circuit of this comparative example becomes difficult.

First Example Embodiment

Next, a first example embodiment of the present disclosure will be described in detail with reference to the drawings.

<Configuration>

Figure 1:
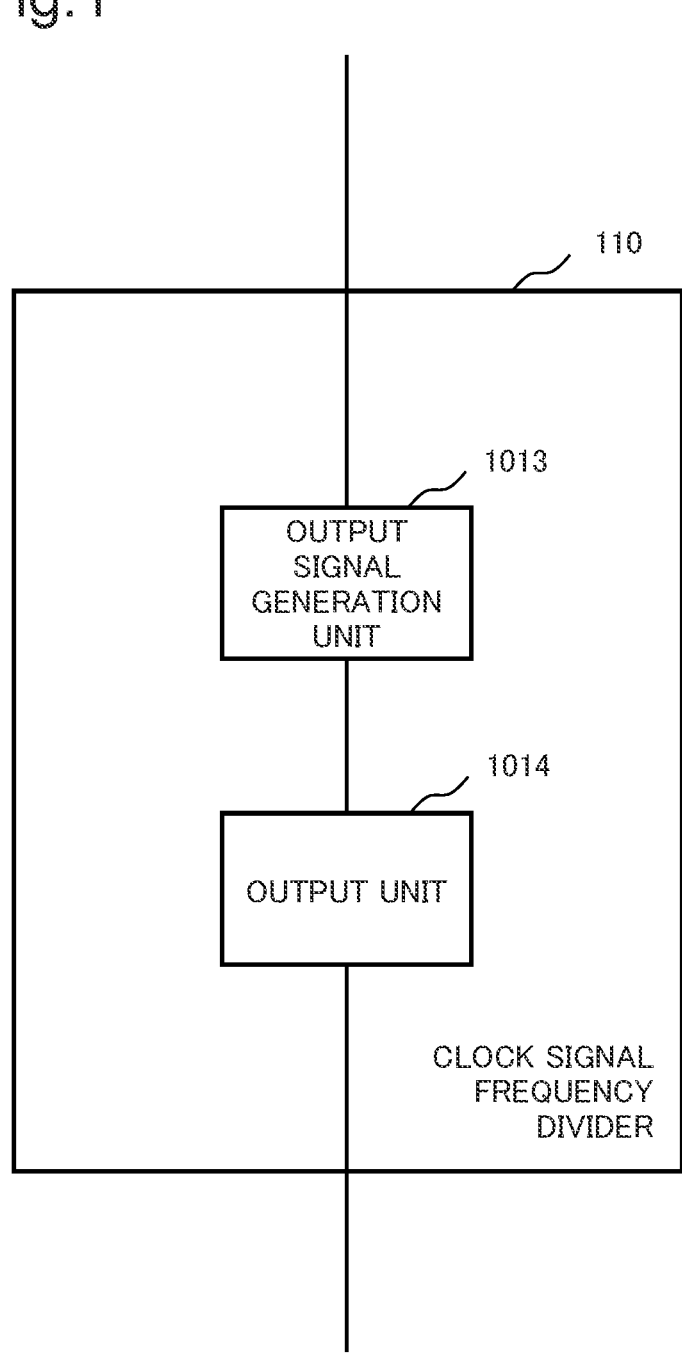
FIG. 1 is a block diagram illustrating an example of a configuration of a clock signal frequency divider according to a first example embodiment of the present disclosure.

FIG. 1 is a block diagram illustrating an example of a configuration of a clock signal frequency divider 110 according to the first example embodiment of the present disclosure. In the example illustrated in FIG. 1, the clock signal frequency divider 110 according to the present example embodiment includes an output signal generation unit 1013 and an output unit 1014.

The output signal generation unit 1013 generates an output clock signal in which a periodic pattern signal is repeated from a pulse of a received input clock signal. The periodic pattern signal is a signal in which pulses of a mask pulse number smaller than a periodic pulse number among consecutive pulses of the periodic pulse number are masked. Then, the periodic pattern signal includes a marker portion including at least one unmasked pulse at a start portion of the periodic pattern signal.

The output unit 1014 outputs the output clock signal.

The output signal generation unit 1013 generates the periodic pattern signal in such a way that a pattern of a timing of the at least one unmasked pulse of the marker portion does not appear in a portion other than a portion matching the marker portion in the output clock signal.

The above-described input clock signal corresponds to a clock S to be described later. The above-described pulse corresponds to a clock pulse to be described later. The above-described periodic pattern signal corresponds to a portion associated to a period in which a phase relationship between clocks of generated clock signals to be described later completes one cycle. The above-described periodic pulse number corresponds to a frequency division ratio denominator M to be described later. The above-described mask pulse number corresponds to a value obtained by subtracting a frequency division ratio numerator N to be described later from the frequency division ratio denominator M.

<Operation>

Next, an operation of the clock signal frequency divider 110 according to the first example embodiment of the present disclosure will be described in detail with reference to the drawings.

Figure 2:
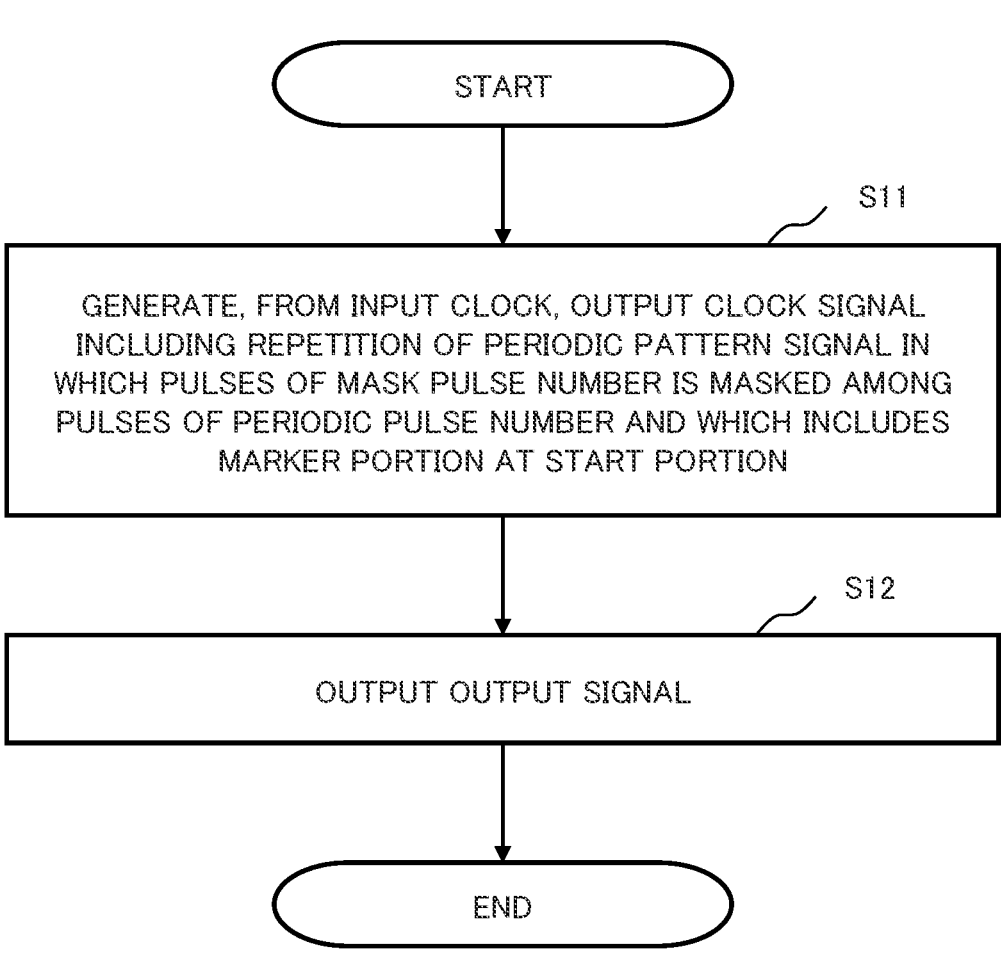
FIG. 2 is a flowchart illustrating an example of an operation of the clock signal frequency divider according to the first example embodiment of the present disclosure.

FIG. 2 is a flowchart illustrating an example of an operation of the clock signal frequency divider 110 according to the first example embodiment of the present disclosure.

In the example illustrated in FIG. 2, first, the output signal generation unit 1013 generates, from the input clock, the output clock signal in which the periodic pattern signal in which the pulses of the mask pulse number among the pulses of the periodic pulse number are masked and which includes the marker portion at the start portion is repeated (step S11). Then, the output unit 1014 outputs the output signal (step S12).

<Effects>

An effect of reducing the costs and facilitating the timing design can be obtained. This is because the output signal generation unit 1013 generates the output clock signal in which the periodic pattern signal including the marker portion at the start portion is repeated.

In a case where a circuit operating with a first clock signal subjected to rational number frequency division at a certain frequency division ratio communicates with a communication counterpart circuit operating with a second clock signal subjected to rational number frequency division at a different frequency division ratio, it is generally necessary to supply communication timing information to the circuits as described above. The communication timing information is information indicating a timing at which two circuits can communicate with each other. Even in a case where these two circuits are given information of patterns of clock pulses of the first clock signal and the second clock signal, it is generally not possible to specify where the start of a portion associated to a period in which a phase relationship between clocks of the two clock signals completes one cycle is positioned. Therefore, it is not possible to specify which timing is a timing at which there are clock pulses in both of the two clock signals. Therefore, in order for these two circuits to perform communication, it is necessary to supply the communication timing information to the circuits.

However, in order to supply the communication timing information to the circuits, as described above, the timing design becomes difficult, and the costs also increase. However, the circuits as described above can specify the start of the portion associated to the period in which the phase relationship between the clocks of two clock signals completes one cycle by generating the output clock signal in which the periodic pattern signal including the marker portion at the start portion is repeated as in the present example embodiment. Therefore, it is not necessary to supply the communication timing information to the circuits. Therefore, the timing design for supplying the communication timing information to the circuits is not necessary. Therefore, the timing design can be facilitated. Furthermore, the cost for timing design for supplying the communication timing information to the circuits is not required, and the costs can be reduced.

Second Example Embodiment

Hereinafter, a second example embodiment of the present disclosure will be described in detail with reference to the drawings.

Figure 3:
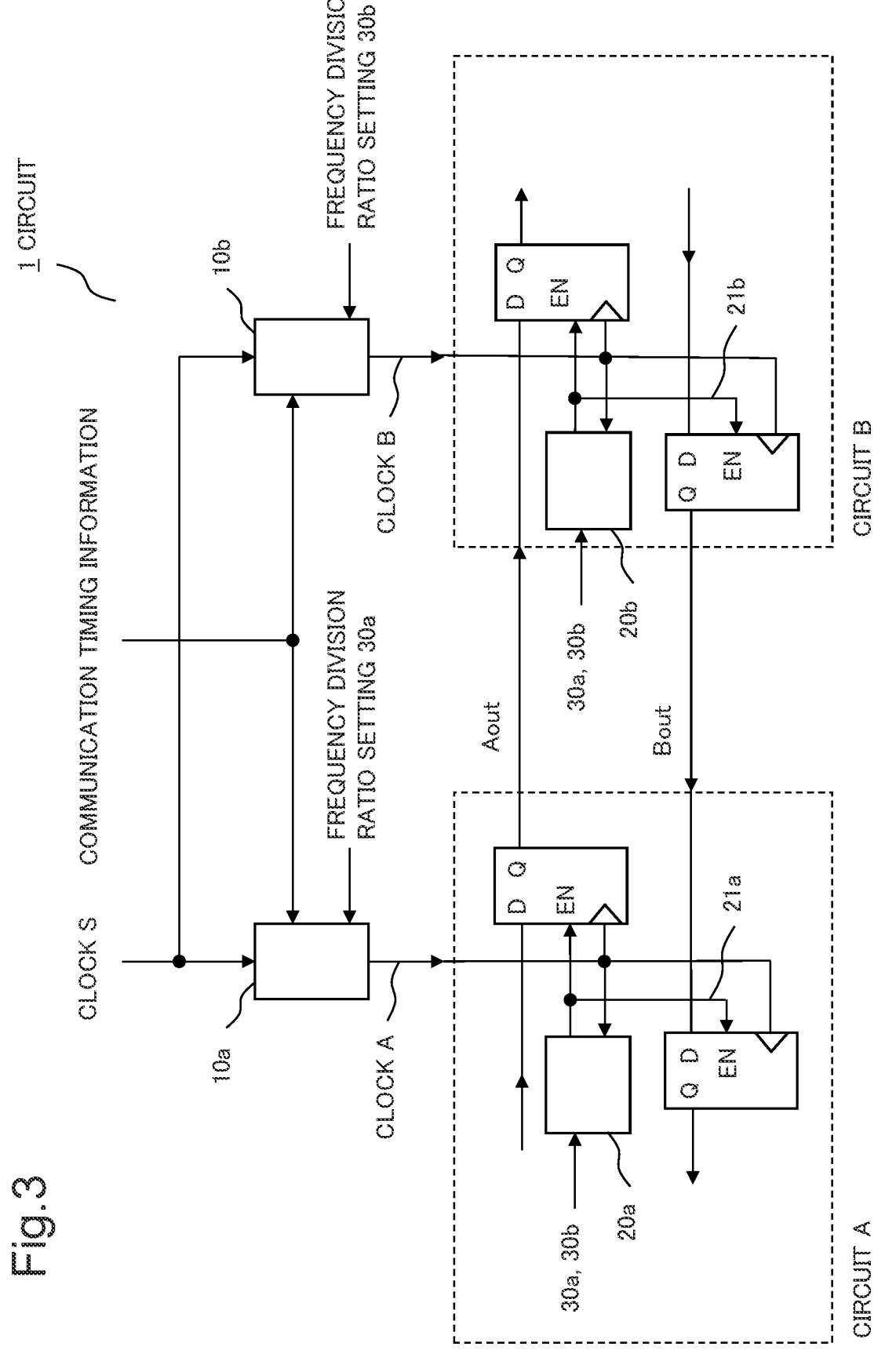
FIG. 3 is a diagram illustrating an example of a configuration of a circuit according to a second example embodiment of the present disclosure.

FIG. 3 is a diagram illustrating an example of a configuration of a circuit according to the second example embodiment of the present disclosure. In the example illustrated in FIG. 3, a circuit 1 according to the present example embodiment includes a clock signal frequency dividing circuit 10*a*, a clock signal frequency dividing circuit 10*b*, a circuit A, and a circuit B.

The clock signal frequency dividing circuit 10*a* is connected to the circuit A. A clock S, which is a clock signal, is supplied to the clock signal frequency dividing circuit 10*a*. The clock signal frequency dividing circuit 10*a* receives a frequency division ratio setting 30*a* indicating a frequency division ratio setting of a clock A and communication timing information indicating a timing of communication between the circuit A operating with the clock A and the circuit B operating with a clock B. The clock signal frequency dividing circuit 10*a* performs rational number frequency division on the clock S by using the frequency division ratio setting 30*a* and the communication timing information to generate a clock signal (that is, the clock A), and outputs the generated clock A. The clock A is supplied to the circuit A.

The clock signal frequency dividing circuit 10*b* is connected to the circuit B. The clock S, which is a clock signal, is supplied to the clock signal frequency dividing circuit 10*b*. The clock signal frequency dividing circuit 10*b* receives a frequency division ratio setting 30*b* indicating the frequency division ratio setting of the clock B and communication timing information indicating a timing of communication between the circuit A operating with the clock A and the circuit B operating with the clock B. The clock signal frequency dividing circuit 10*b* performs rational number frequency division on the clock S by using the frequency division ratio setting 30*b* and the communication timing information to generate a clock signal (that is, the clock B), and outputs the generated clock B. The clock B is supplied to the circuit B.

The clock signal frequency dividing circuit 10*a* and the clock signal frequency dividing circuit 10*b* are circuits having the same configuration. However, the clock signal frequency dividing circuit 10*a* and the clock signal frequency dividing circuit 10*b* are different from each other in the frequency division ratio setting to be received and connected circuits. In the following description, in a case where the clock signal frequency dividing circuit 10*a* and the clock signal frequency dividing circuit 10*b* are not distinguished, the clock signal frequency dividing circuit 10*a* and the clock signal frequency dividing circuit 10*b* are collectively referred to as a clock signal frequency dividing circuit 10.

As described later, in a case where a frequency division ratio is N/M (N<M, and N and M are natural numbers), the clock signal frequency dividing circuit 10*a* and the clock signal frequency dividing circuit 10*b* mask M-N clock pulses among M consecutive clock pulses of the clock S. Then, the clock signal frequency dividing circuit 10*a* and the clock signal frequency dividing circuit 10*b* each output a clock signal in which a signal in which M-N clock pulses among the M consecutive clock pulses are masked is repeated. As a result, the clock signal frequency dividing circuit 10*a* and the clock signal frequency dividing circuit 10*b* perform rational number frequency division on the clock S. The clock pulses to be masked will be described in detail later.

The clock A is supplied from the clock signal frequency dividing circuit 10*a* to the circuit A. The circuit A operates with the clock A. The clock B is supplied from the clock signal frequency dividing circuit 10*b* to the circuit B. The circuit B operates with the clock B.

The circuit A includes a communication control circuit 20*a*. The circuit B includes a communication control circuit 20*b*. The communication control circuit 20*a* and the communication control circuit 20*b* are circuits having the same configuration. The communication control circuit included in the circuit A is referred to as the communication control circuit 20*a*. The communication control circuit included in the circuit B is referred to as the communication control circuit 20*b*.

The circuit A and the circuit B communicate with each other via a signal Aout and a signal Bout at the above-described communication timing. The signal Aout is a signal that is output by the circuit A at a timing of the clock A and input to the circuit B at a timing of the clock B. The signal Bout is a signal that is output by the circuit B at the timing of the clock B and input to the circuit A at the timing of the clock A. The communication control circuit 20*a* and the communication control circuit 20*b* control these communications. The communication control circuit 20*a* and the communication control circuit 20*b* will be described in detail later.

Figure 4:
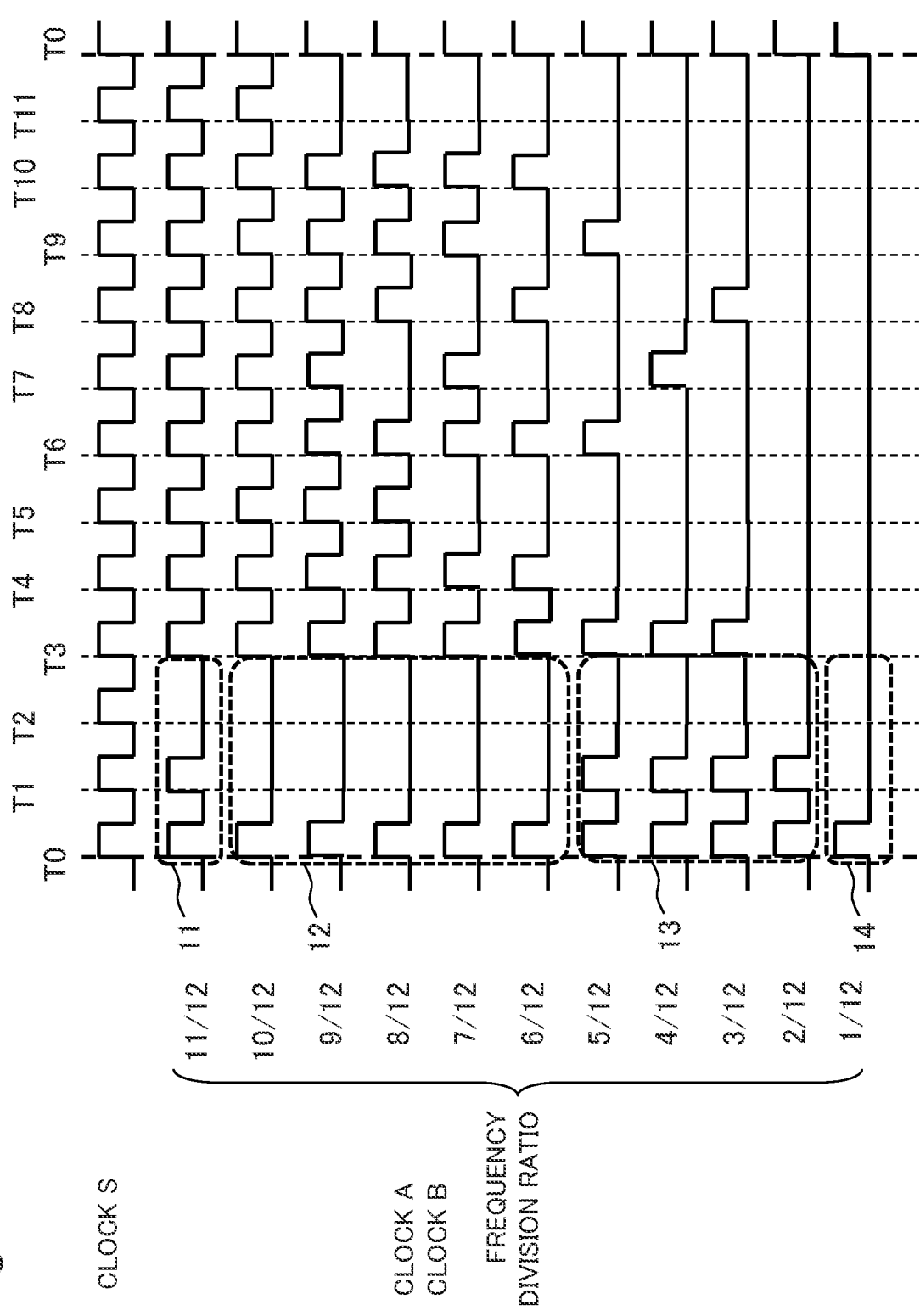
FIG. 4 is a diagram illustrating an example of a clock signal frequency-divided by the clock signal frequency dividing circuit according to the second example embodiment of the present disclosure.

FIG. 4 is a diagram illustrating an example of a clock signal frequency-divided by the clock signal frequency dividing circuit according to the second example embodiment of the present disclosure. FIG. 4 illustrates an example of the clock S and a clock signal (that is, the clock A and the clock B) obtained by performing rational number frequency division on the clock S. FIG. 4 illustrates an example of the clock signals generated by frequency-dividing the clock S with the frequency division ratio of 11/12 to 1/12 as the clock A and the clock B.

In the example illustrated in FIG. 4, frequency division ratio denominators of the clock A and the clock B with respect to the clock S are both 12. Therefore, a phase relationship between the clock A and the clock B completes one cycle in 12 cycles of the clock S. In FIG. 4, the timings of 12 cycles in which the phase relationship completes one cycle are indicated by T0 to T11. Both the circuit A and the circuit B communicate with each other at a timing at which there is a clock pulse. For example, in a case where the frequency division ratio of the clock A is 7/12 and the frequency division ratio of the clock B is any one of 11/12 to 7/12, both the circuit A and the circuit B communicate with each other at the timings T0, T3, T4, T6, T7, T9, and T10, which are timings at which there is a clock pulse.

In the clock signal frequency dividing circuit 10*a* and the clock signal frequency dividing circuit 10*b*, a marker portion for identifying the start of a period in which the phase relationship between the clocks of the generated clock signals completes one cycle is provided at the start of the period. In other words, the clock signal frequency dividing circuit 10*a* and the clock signal frequency dividing circuit 10*b* generate the clock signals in such a way that the marker portion is at the start of the period in which the phase relationship between the clocks completes one cycle. The marker portion is a part of the clock signal that includes at least one unmasked clock pulse. A pattern of a timing of the unmasked clock pulse in the marker portion is set in such a way as not to match a pattern of a timing of an unmasked clock pulse in a portion other than the marker portion of an output clock signal. In this case, a portion of the output clock signal where there is a pattern that matches the pattern of the timing of the unmasked clock pulse of the marker portion is the marker portion.

In the example of FIG. 4, the first three cycles of the period of 12 cycles in which the phase relationship between the generated clock signals completes one cycle are the marker portion. A length of the marker portion is appropriately determined according to a length of the period in which the phase relationship completes one cycle. As illustrated in FIG. 4, a type of marker portion (any one of marker portions 11 to 14 in the example of FIG. 4) associated to the frequency division ratio is provided. In the example of FIG. 4, the marker portions are distinguished by the pattern of the timing of the unmasked clock pulse. In the example of FIG. 4, the marker portions are further distinguished by continuity of the same pattern in a case where output clocks are arranged side by side as illustrated in FIG. 4. That is, the marker portions in a case where the frequency division ratio is any of 10/12 to 6/12 illustrated in FIG. 4 are marker portions of the same pattern, and the clocks in a case where the frequency division ratio is any of 10/12 to 6/12 are continuously illustrated (in other words, arranged side by side) in FIG. 4. Therefore, the same reference numeral is assigned to the marker portions in a case where the frequency division ratio is any one of 10/12 to 6/12. Similarly, the marker portions in a case where the frequency division ratio is any of 5/12 to 2/12 illustrated in FIG. 4 are marker portions of the same pattern, and the clocks in a case where the frequency division ratio is any of 5/12 to 2/12 are continuously illustrated (in other words, arranged side by side) in FIG. 4. Therefore, the same reference numeral is assigned to the marker portions in a case where the frequency division ratio is any one of 5/12 to 2/12. The pattern of the timing of the unmasked clock pulse is a pattern of the presence or absence of the unmasked clock pulse associated to the length of the marker portion (three cycles in the example of FIG. 4).

Specifically, the marker portions 11 to 14 illustrated in FIG. 4 are as described below. In the following description, "with clock pulse" in a cycle represents that the clock pulse is not masked in the cycle, in other words, there is an unmasked clock pulse in the cycle. "Without clock pulse" in a cycle represents that the clock pulse is masked in the cycle, in other words, there is no clock pulse (that is, no unmasked clock pulse) in the cycle.

Specifically, the marker portion 11 is a marker portion in a case where the frequency division ratio is 11/12. The marker portion 11 is a pattern of three consecutive cycles of a cycle with clock pulse, a cycle without clock pulse, and a cycle with clock pulse.

The marker portion 12 is a marker portion in a case where the frequency division ratio is any of 10/12 to 6/12. The marker portion 12 is a pattern of three consecutive cycles of a cycle with clock pulse, a cycle without clock pulse, and a cycle without clock pulse.

The marker portion 13 is a marker portion in a case where the frequency division ratio is any of 5/12 to 2/12. The marker portion 13 is a pattern of three consecutive cycles of a cycle with clock pulse, a cycle with clock pulse, and a cycle without clock pulse.

The marker portion 14 is a marker portion in a case where the frequency division ratio is 1/12. The marker portion 14 is a pattern of three consecutive cycles of a cycle with clock pulse, a cycle without clock pulse, and a cycle without clock pulse.

In addition, in a case where the frequency division ratio is 11/12, a cycle without clock pulse exists only in a part of the marker portion 11. In a case where the frequency division ratio is any one of 10/12 to 6/12, a portion having two consecutive cycles without clock pulse exists only in the marker portion 12. In a case where the frequency division ratio is any one of 5/12 to 2/12, a portion having two consecutive cycles with clock pulse exists only in the marker portion 13. In a case where the frequency division ratio is 1/12, a cycle with clock pulse exists only in a part of the marker portion 14. In these examples, the first cycles of the marker portions 11 to 14 are cycles with clock pulse. In this manner, the same pattern as the pattern of the presence or absence of the clock pulse of the marker portion does not appear in a portion other than the marker portion of the output clock.

More generally, the marker portion in the example of FIG. 4 in a case where the frequency division ratio is represented as N/M (N and M are natural numbers, and N>M) is described as follows.

The marker portion in a case where N=M−1 is the marker portion 11 of three consecutive cycles of a cycle with clock pulse, a cycle without clock pulse, and a cycle with clock pulse. The marker portion in a case where M/2≤N and N<M−1 is the marker portion 12 of three consecutive cycles of a cycle with clock pulse, a cycle without clock pulse, and a cycle without clock pulse. The marker portion in a case where 2≤N and N<M/2 is the marker portion 13 of three consecutive cycles of a cycle with clock pulse, a cycle with clock pulse, and a cycle without clock pulse. The marker portion in a case where N=1 is the marker portion 14 of three consecutive cycles of a cycle with clock pulse, a cycle without clock pulse, and a cycle without clock pulse.

In a case where N=M−1, a cycle without clock pulse exists only in a part of the marker portion 11. In a case where M/2≤N and N<M−1, a portion having two consecutive cycles without clock pulse exists only in the marker portion 12. In a case where 2≤N and N<M/2, a portion having two consecutive cycles with clock pulse exists only in the marker portion 13. In a case where N=1, a cycle with clock pulse exists only in a part of the marker portion 14.

As described above, for each frequency division ratio, a pattern of the clock pulses of the marker portion (that is, one marker portion determined according to the frequency division ratio among the marker portions 11 to 14) according to the frequency division ratio appears only at the start of the period in which the phase relationship completes one cycle. Therefore, the circuit A and the circuit B can identify (that is, specify) the start of the period in which the phase relationship completes one cycle by detecting any one of the marker portions 11 to 14 determined according to the frequency division ratio of the clock A or the clock B driving the circuit A or B. As a result, the circuit A and the circuit B can determine whether there is a clock pulse in both the clock A and the clock B in any cycle from the frequency division ratios of the clock A and the clock B and a timing of the start of the period in which the phase relationship completes one cycle.

Specifically, the communication control circuit 20a included in the circuit A illustrated in FIG. 3 generates a communication control signal 21a in the following steps, and outputs the generated communication control signal 21a.

(1) The communication control circuit 20a detects the marker portion of the clock A from the frequency division ratio setting 30a which is input frequency division ratio setting information of the clock A and the clock A. For example, the communication control circuit 20a detects a timing at which the marker portion determined from the frequency division ratio setting 30a appears in the clock A. Then, the communication control circuit 20a specifies a timing of the clock pulse (specifically, for example, a timing of a rising edge of the clock pulse) at the start of the detected marker portion as a timing of the start of the period in which the phase relationship between the clock A and the clock B completes one cycle.

(2) The communication control circuit 20*a* determines a timing at which there is a clock pulse in both the clock A and the clock B from the specified timing of the start of the period, the input frequency division ratio setting 30*a*, and the frequency division ratio setting 30*b* which is input frequency division ratio setting information of the clock B. From the frequency division ratio setting 30*a*, the timing at which there is a clock pulse based on the timing of the start of the period in the clock A is determined. In addition, the timing at which there is a clock pulse based on the timing of the start of the period in the clock B is determined from the frequency division ratio setting 30*b*. From the frequency division ratio setting 30*a* and the frequency division ratio setting 30*b*, it is possible to specify the timing at which there is a clock pulse in both the clock A and the clock B based on the timing of the start of the period. The communication control circuit 20*a* determines the timing at which there is a clock pulse in both the clock A and the clock B determined from the frequency division ratio setting 30*a* and the frequency division ratio setting 30*b* based on the specified timing of the start of the period as the timing at which there is a clock pulse in both the clock A and the clock B.

(3) The communication control circuit 20*a* sets the determined timing at which there is a clock pulse in both the clock A and the clock B as a timing at which the circuit A communicates with the circuit B. The communication control circuit 20*a* outputs a signal indicating the timing at which the circuit A communicates with the circuit B as the communication control signal 21*a*.

Similarly, the communication control circuit 20*b* included in the circuit B generates a communication control signal 21*b* in the following steps and outputs the generated communication control signal 21*b*.

(1) The communication control circuit 20*b* detects the marker portion of the clock B from the frequency division ratio setting 30*b* which is input frequency division ratio setting information of the clock B and the clock B. For example, the communication control circuit 20*b* detects a timing at which the marker portion determined from the frequency division ratio setting 30*b* appears in the clock B. Then, the communication control circuit 20*b* specifies a timing of the clock pulse (specifically, for example, a timing of a rising edge of the clock pulse) at the start of the detected marker portion as a timing of the start of the period in which the phase relationship between the clock A and the clock B completes one cycle.

(2) The communication control circuit 20*b* determines a timing at which there is a clock pulse in both the clock A and the clock B from the specified timing of the start of the period, the input frequency division ratio setting 30*b*, and the frequency division ratio setting 30*a* which is the input frequency division ratio setting information of the clock A. As described above, from the frequency division ratio setting 30*a*, the timing at which there is a clock pulse based on the timing of the start of the period in the clock A is determined. In addition, the timing at which there is a clock pulse based on the timing of the start of the period in the clock B is determined from the frequency division ratio setting 30*b*. From the frequency division ratio setting 30*a* and the frequency division ratio setting 30*b*, it is possible to specify the timing at which there is a clock pulse in both the clock A and the clock B based on the timing of the start of the period. The communication control circuit 20*b* determines the timing at which there is a clock pulse in both the clock A and the clock B determined from the frequency division ratio setting 30*a* and the frequency division ratio setting 30*b* based on the specified timing of the start of the period as the timing at which there is a clock pulse in both the clock A and the clock B.

(3) The communication control circuit 20*b* sets the determined timing at which there is a clock pulse in both the clock A and the clock B as a timing at which the circuit B communicates with the circuit A. Then, the communication control circuit 20*b* outputs a signal indicating the timing at which the circuit A communicates with the circuit B as the communication control signal 21*b*.

The circuit A outputs the signal Aout at the communication timing at which the circuit B communicates with the circuit A and which is indicated by the communication control signal 21*a* by referring to the communication control signal 21*a*, and receives the input signal Bout. The circuit B outputs the signal Bout at the communication timing at which the circuit B communicates with the circuit A and which is indicated by the communication control signal 21*b* by referring to the communication control signal 21*b*, and receives the input signal Aout. With the above operation, efficient inter-block data communication is implemented between the circuit A and the circuit B.

Next, the clock signal frequency dividing circuit 10 according to the second example embodiment of the present disclosure will be described in detail. As described above, the clock signal frequency dividing circuit 10*a* and the clock signal frequency dividing circuit 10*b* have the same configuration. The clock signal frequency dividing circuit 10*a* and the clock signal frequency dividing circuit 10*b* are collectively referred to as the clock signal frequency dividing circuit 10.

Figure 5:
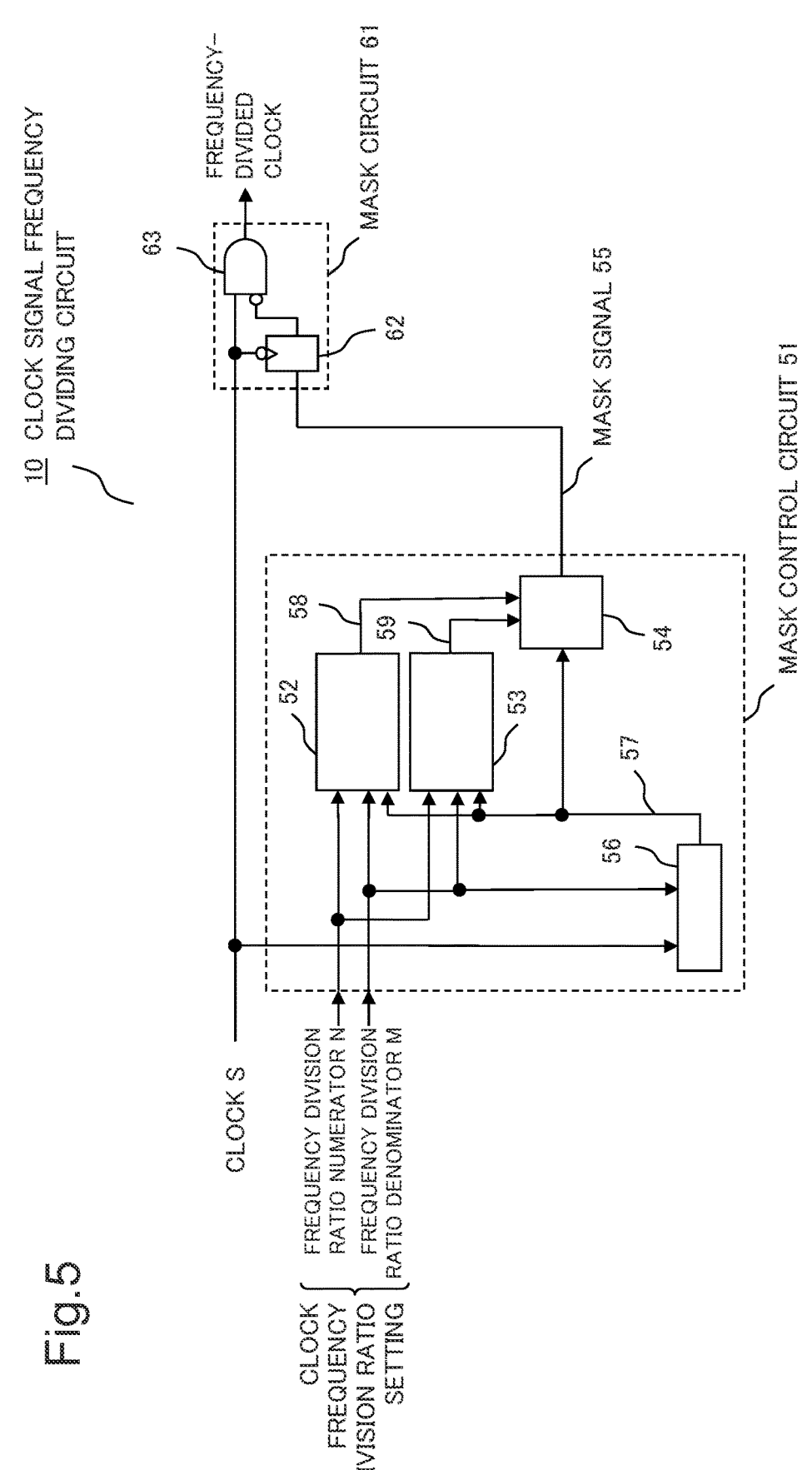
FIG. 5 is a diagram illustrating a configuration of the clock signal frequency dividing circuit according to the second example embodiment of the present disclosure.

FIG. 5 is a diagram illustrating a configuration of the clock signal frequency dividing circuit 10 according to the second example embodiment of the present disclosure. As described above, FIG. 5 illustrates the configuration of the clock signal frequency dividing circuit 10*a* and the clock signal frequency dividing circuit 10*b* described above. In the example illustrated in FIG. 5, the clock signal frequency dividing circuit 10 includes a mask control circuit 51 and a mask circuit 61. The clock signal frequency dividing circuit 10 receives the clock S and the clock frequency division ratio setting. The clock signal frequency dividing circuit 10 performs frequency division on the clock S according to the clock frequency division ratio setting to generate the frequency-divided clocks. In a case where the frequency division ratio indicated by the clock frequency division ratio setting is N/M (N<M, and N and N are natural numbers), the clock signal frequency dividing circuit 10 frequency-divides the clock S with the frequency division ratio N/M. The clock signal frequency dividing circuit 10 outputs the generated frequency-divided clocks. The above-described clock A and clock B are the frequency-divided clocks.

The clock S and the clock frequency division ratio setting are input to the mask control circuit 51. The mask control circuit 51 receives the clock S and the clock frequency division ratio setting. The mask control circuit 51 operates at a timing of the clock S. The mask control circuit 51 generates a mask signal 55 for each cycle of the clock S by referring to the input clock frequency division ratio setting. In other words, the mask control circuit 51 generates the mask signal 55 to be used to mask the clock pulse of the clock S for each cycle of the clock S in such a way that the clock S is frequency-divided into the frequency-divided clocks according to the input clock frequency division ratio setting. The clock frequency division ratio setting includes a signal representing the frequency division ratio denominator M indicating the value of the denominator of the frequency division ratio and a signal representing the frequency division ratio numerator N indicating the value of the numerator of the frequency division ratio.

The mask control circuit 51 includes a marker portion mask signal generation unit 52, a non-marker portion mask signal generation unit 53, a selection circuit 54, and a counter circuit 56.

The clock S and the signal representing the frequency division ratio denominator M are input to the counter circuit 56. The counter circuit 56 receives the clock S and the signal representing the frequency division ratio denominator M. The counter circuit 56 operates at the timing of the clock S. The counter circuit 56 repeatedly counts the number of cycles, which is a period in which the pattern of the clock pulses of the frequency-divided clocks generated by the clock signal frequency dividing circuit 10 completes one cycle, by referring to the frequency division ratio denominator M. The frequency division ratio denominator M represents the period in which the pattern of the clock pulses of the frequency-divided clocks generated by the clock signal frequency dividing circuit 10 completes one cycle.

Specifically, the counter circuit 56 counts the clock pulse of the clock S. Once the next clock pulse is counted in a case where the number of counted clock pulses (that is, the number of cycles) is M−1, the counter circuit 56 returns the number of counted clock pulses to 0. Then, the counter circuit 56 continues counting the clock pulse. In this manner, the counter circuit repeats counting from 0 to M−1. The counter circuit 56 outputs a signal representing the counted value as a counter value 57 (specifically, a signal representing the counter value 57). The counter value 57 is used as a signal indicating the order of the current cycle in the period in which the pattern of the clock pulses of the frequency-divided clocks completes one cycle.

The clock frequency division ratio setting (that is, the signal representing the frequency division ratio denominator M and the signal representing the frequency division ratio numerator N) and the signal representing the counter value 57 are input to the marker portion mask signal generation unit 52. The marker portion mask signal generation unit 52 receives the clock frequency division ratio setting and the signal representing the counter value 57. The marker portion mask signal generation unit 52 generates a mask signal 58 associated to the marker portion determined according to the input clock frequency division ratio setting by referring to the input clock frequency division ratio setting and the counter value 57. The mask signal 58 is also referred to as a marker portion mask signal. The mask signal 58 associated to the marker portion is a mask signal 58 which is a signal indicating whether there is a clock pulse at a timing of the order indicated by the input counter value in the marker portion.

In other words, the marker portion mask signal generation unit 52 generates the mask signal 58 which is a signal indicating whether there is a clock pulse at the timing of the order indicated by the input counter value in the marker portion determined for the frequency division ratio indicated by the input clock frequency division ratio setting.

The marker portion mask signal generation unit 52 generates the mask signal 58 as described below, for example. In the marker portion of the example described above, there is a clock pulse at the timing of the start of the period in which the phase relationship between the clock A and the clock B completes one cycle. The mask signal 58 indicates, for example, a value indicating that masking is not performed at the timing of the start of the period in which the phase relationship between the clock A and the clock B completes one cycle. In the description of the present example embodiment, the value indicating that masking is not performed is, for example, 0. As will be described later, the mask signal 58 indicates a value indicating 0 at a timing at which a signal of an unmasked portion of the clock signal generated by the frequency division is output. Therefore, the value indicated by the mask signal 58 does not change from 0 at the timing of the start of the period in which the phase relationship between the clock A and the clock B completes one cycle. The mask signal 58 changes from a value indicating 0 to a value indicating that masking is performed at a timing at which there is no clock pulse next to a timing at which there is a clock pulse in the marker portion. In the description of the present example embodiment, the value indicating that masking is performed is, for example, 1. The mask signal 58 changes from a value indicating 1 to the value indicating 0 at a timing at which there is a clock pulse next to a timing at which there is no clock pulse in the marker portion. The mask signal 58 changes from the value indicating 1 to the value indicating 0 in a case where the timing of the clock pulse of the marker portion next to the timing at which the clock pulse is masked is a timing included in a non-marker portion instead of the marker portion. A timing at which the value of the mask signal 58 changes is, for example, the timing of the rising edge of the clock pulse of the clock S.

The mask signal is used to mask the clock pulse of the clock S at a timing at which there is no clock pulse of the order indicated by the input counter value in the marker portion determined for the input clock frequency division ratio setting.

In the description of the present example embodiment, the marker portion is, for example, any one of the marker portions 11 to 14 illustrated in FIG. 4. Specifically, the marker portion mask signal generation unit 52 generates, for example, the mask signal 58 associated to the marker portion exemplified below for the frequency division ratio denominator M and the frequency division ratio numerator N.

In a case where N=M−1, the marker portion mask signal generation unit 52 generates the mask signal associated to the marker portion 11.

In a case where M/2≤N and N<M−1, the marker portion mask signal generation unit 52 generates the mask signal associated to the marker portion 12.

In a case where 2≤N and N<M/2, the marker portion mask signal generation unit 52 generates the mask signal associated to the marker portion 13.

In a case where N=1, the marker portion mask signal generation unit 52 generates the mask signal associated to the marker portion 14.

The clock frequency division ratio setting and the counter value 57 are input to the non-marker portion mask signal generation unit 53. The non-marker portion mask signal generation unit 53 receives the clock frequency division ratio setting and the counter value 57. The non-marker portion mask signal generation unit 53 generates a mask signal 59 associated to the non-marker portion which is a portion other than the marker portion in the period in which the phase relationship between the frequency-divided clocks (for example, the clock A and the clock B) completes one cycle by referring to the input clock frequency division ratio setting and the counter value 57. The mask signal 59 is also referred to as a non-marker portion mask signal. The mask signal 59 associated to the non-marker portion is a mask signal 59 which is a signal indicating whether there is a clock pulse at a timing of the order indicated by the input counter value in the non-marker portion.

In other words, the non-marker portion mask signal generation unit 53 generates the mask signal 59 which is a signal indicating whether there is a clock pulse at the timing of the order indicated by the input counter value in the non-marker portion determined for the frequency division ratio indicated by the input clock frequency division ratio setting.

The non-marker portion mask signal generation unit 53 generates the mask signal 59 as described below, for example. In the following description, a value of the mask signal 59 indicating that the clock pulse is not masked is 0. The value of the mask signal 59 indicating that the clock pulse is masked is 1. For example, in a case where the value of the mask signal 59 is a value indicating 0 at a timing immediately before the timing of the start of the period in which the phase relationship between the frequency-divided clocks (that is, the clock A and the clock B) completes one cycle, the value of the mask signal 59 does not change from the value indicating 0 at the timing of the start. For example, in a case where the value of the mask signal 59 is a value indicating 1 at a timing immediately before the timing of the start of the period in which the phase relationship between the frequency-divided clocks completes one cycle, the value of the mask signal 59 changes from the value indicating 1 at the timing of the start to the value indicating 0. The mask signal 59 indicates, for example, the value indicating 0 at a timing of the clock pulse included in the marker portion. In a case where the mask signal 59 indicates 0 at a timing immediately before a timing at which the clock pulse is not masked in the non-marker portion, the value indicated by the mask signal 59 does not change from the value indicating 0 at the timing at which the clock pulse is not masked. In a case where the mask signal 59 indicates 1 at a timing before the timing at which the clock pulse is not masked in the non-marker portion, the value indicated by the mask signal 59 changes from the value indicating 1 to the value indicating 0 at the timing at which the clock pulse is not masked. In a case where the mask signal 59 indicates 0 at the timing immediately before a timing at which the clock pulse is masked in the non-marker portion, the value indicated by the mask signal 59 changes from the value indicating 0 to the value indicating 1 at the timing at which the clock pulse is masked. In a case where the mask signal 59 indicates 1 at the timing before the timing at which the clock pulse is masked in the non-marker portion, the value indicated by the mask signal 59 does not change from the value indicating 1 at the timing at which the clock pulse is masked. A timing at which the value of the mask signal 58 changes is, for example, the timing of the rising edge of the clock pulse of the clock S.

The mask signal 59 generated by the non-marker portion mask signal generation unit 53 is determined according to the clock frequency division ratio setting (that is, the frequency division ratio denominator M and the frequency division ratio numerator N). Specifically, in the example of the clock signal S, the clock signal A, and the clock signal B illustrated in FIG. 4, the non-marker portion mask signal generation unit 53 generates the mask signal 59 for the frequency division ratio denominator M and the frequency division ratio numerator N as follows.

The marker portion in a case where N=M−1 is the marker portion 11. The length of the marker portion 11 is three cycles. The marker portion 11 includes two clock pulses. In other words, one clock pulse of the clock S is masked in the marker portion 11. In this case, in the non-marker portion, which is a portion other than the marker portion 11, of the clock signal output in the period in which the phase relationship between the frequency-divided clocks completes one cycle, (N−2)=(M−3) clock pulses among (M−3) clock pulses are not masked. That is, in this case, the clock pulse is not masked at timings of all the cycles of the non-marker portion. In this case, the non-marker portion mask signal generation unit 53 generates a signal indicating that mask processing is not performed in the non-marker portion as the mask signal 59. That is, the non-marker portion mask signal generation unit 53 generates the mask signal 59 that does not change from a value (for example, 0) indicating that masking is not performed in the unmasked portion.

The marker portion in a case where M/2≤N and N<M−1 is the marker portion 12. The length of the marker portion 12 is three cycles. The marker portion 12 includes one clock pulse. In this case, in the non-marker portion, (N−1) clock pulses among the clock pulses at timings of (M−3) cycles are not masked, and (M−N−2) clock pulses are masked. Then, a clock pulse of a cycle immediately before the cycle included in the non-marker portion in which the clock pulse is masked is not masked.

For example, in the example illustrated in FIG. 4, in the marker portion 12, the clock pulse at the first timing among the timings of the three cycles is not masked, and the clock pulses at the timings of the next two consecutive cycles are masked. Since the clock pulses at the timings of the second and third cycles among the timings of the three cycles of the marker portion 12 are masked, the mask signal 59 indicates that the clock pulse of the first cycle of the non-marker portion is not to be masked. The non-marker portion mask signal generation unit 53 generates the mask signal 59 indicating that (M−N−2) clock pulses for which the clock pulse at the immediately previous timing is not masked among (M−3) clock pulses are masked in the non-marker portion.

In this case, for example, the non-marker portion mask signal generation unit 53 generates the mask signal 59 which is a mask signal for implementing (N−1)/(M−3) frequency division in the non-marker portion and indicates that the clock pulses of two consecutive cycles are not masked. The mask signal 59 for implementing (N−1)/(M−3) frequency division in the non-marker portion is, for example, a mask signal indicating a clock pulse to be masked as a result of performing the (N−1)/(M−3) frequency division using any of the existing methods of performing rational number frequency division. The mask signal 59 which indicates that the clock pulses of two consecutive cycles are not masked in the non-marker portion is a mask signal generated in such a way that the clock pulse at a timing immediately before a timing of the masked clock pulse of the non-marker portion is not masked. The immediately previous timing in this case is not limited to a timing included in the non-marker portion.

The marker portion in a case where 2≤N and N<M/2 is the marker portion 13. In the example illustrated in FIG. 4, the length of the marker portion 13 is three cycles. The marker portion 13 includes two unmasked clock pulses. In this case, among the clock pulses of the (M−3) cycles, the clock pulses of the (N−2) cycles are not masked, and the (M−N−1) clock pulses are masked in the non-marker portion.

In the example illustrated in FIG. 4, the clock pulses of the timing of the first cycle and the timing of the second cycle of the marker portion 13 are not masked. At the timing of the third cycle of the marker portion 13, the clock pulse is masked. In this case, the non-marker portion mask signal generation unit 53 generates the mask signal 59 in such a way that there is no unmasked clock pulse at the timings of two or more consecutive cycles in the unmasked portion, and the clock pulse at the timing of the last cycle of the unmasked portion is masked. In other words, the non-marker portion mask signal generation unit 53 generates the mask signal 59 in such a way that clock pulses of timings of cycles before and after a timing of a cycle of an unmasked clock pulse included in the unmasked portion are masked.

As the mask signal associated to the non-marker portion, the non-marker portion mask signal generation unit 53 generates, for example, the mask signal 59 which is a mask signal for implementing (N−2)/(M−3) frequency division in the non-marker portion and indicates that the clock pulses of two consecutive cycles are not unmasked. The mask signal 59 for implementing (N−2)/(M−3) frequency division in the non-marker portion is, for example, a mask signal indicating a clock pulse to be masked as a result of performing the (N−2)/(M−3) frequency division using any of the existing methods of performing rational number frequency division. The mask signal 59 which indicates that the clock pulses of two consecutive cycles are not unmasked is a mask signal indicating that clock pulses of timings of cycles before and after a timing of a cycle of an unmasked clock pulse included in the unmasked portion are masked.

The marker portion in a case where N=1 is the marker portion 14. The length of the marker portion 14 is three cycles. The marker portion 14 includes one clock pulse. In this case, the number of unmasked clock pulses is (N−1), that is, 0, in the unmasked portion. In this case, the non-marker portion mask signal generation unit 53 generates the mask signal 59 indicating that the clock pulses at the timings of all the cycles of the non-marker portion are masked.

The signal representing the counter value 57, the mask signal 58 (that is, the marker portion mask signal), and the mask signal 59 (that is, the non-marker portion mask signal) are input to the selection circuit 54. The selection circuit 54 receives the signal representing the counter value 57, the mask signal 58, and the mask signal 59. The counter value indicates the order of a cycle in the period in which the pattern of the clock pulses of the frequency-divided clocks completes one cycle. The selection circuit 54 selects, in a case where the counter value 57 indicates a cycle included in the marker portion, the mask signal 58 generated by the marker portion mask signal generation unit 52 by referring to the counter value 57, and outputs the selected mask signal 58 as the mask signal 55. The selection circuit 54 selects, in a case where the counter value 57 indicates a cycle included in the non-marker portion, the mask signal 59 generated by the non-marker portion mask signal generation unit 53 by referring to the counter value 57, and outputs the selected mask signal 59 as the mask signal 55.

The clock S and the mask signal 55 are input to the mask circuit 61. The mask circuit 61 receives the clock S and the mask signal 55. The mask circuit 61 selects whether to mask the pulse of the clock S or output the pulse as it is without masking by referring to the input mask signal 55. In a case where the value of the input mask signal 55 indicates that the clock pulse is not masked at the timing of the clock pulse of the clock S, the mask circuit 61 does not mask the clock pulse of the clock S. In a case where the value of the input mask signal 55 indicates that the clock pulse is masked at the timing of the clock pulse of the clock S, the mask circuit 61 masks the clock pulse of the clock S.

The mask circuit 61 includes a latch circuit 62 and an AND circuit 63.

The mask signal 55 and the negation of the clock S are input to the latch circuit 62. That is, 0 is input to the latch circuit 62 while the clock S is 1, and 1 is input to the latch circuit 62 while the clock S is 0. The latch circuit 62 holds the value of the mask signal 55 input while the clock S is 0. The latch circuit 62 holds the value of the mask signal 55 at a timing at which the clock S becomes 1 even when the value of the input mask signal 55 changes while the clock S is 1. The latch circuit 62 outputs a signal indicating the held value of the mask signal 55.

The clock S and the negation of the signal output by the latch circuit 62 are input to the AND circuit 63. The AND circuit 63 has a function of masking the clock S based on the mask signal 55. The AND circuit 63 masks the clock S in a case where the value of the mask signal 55 is 0. The AND circuit 63 does not mask the clock S in a case where the value of the mask signal 55 is 1.

The latch circuit 62 latches the mask signal 55 at a timing of a falling edge of the clock S, thereby limiting transition of the mask signal 55 input to the AND circuit 63 as the signal output from the latch circuit 62 to a timing at which the value of the clock S is 0. As a result, the latch circuit 62 suppresses a glitch from occurring in the clock B. The latch circuit 62 has an effect of facilitating the timing design. However, in a case where occurrence of a glitch is avoided by strictly performing the timing design, the latch circuit 62 may be omitted. Furthermore, in the example illustrated in FIG. 5, the AND circuit is used as a circuit for masking the clock S, but the present disclosure is not limited thereto. The mask circuit 61 may be implemented using an OR circuit. The mask circuit 61 may be implemented using a circuit having another equivalent function.

Next, the non-marker portion mask signal generation unit 53 according to the second example embodiment of the present disclosure will be described in detail.

Figure 6:
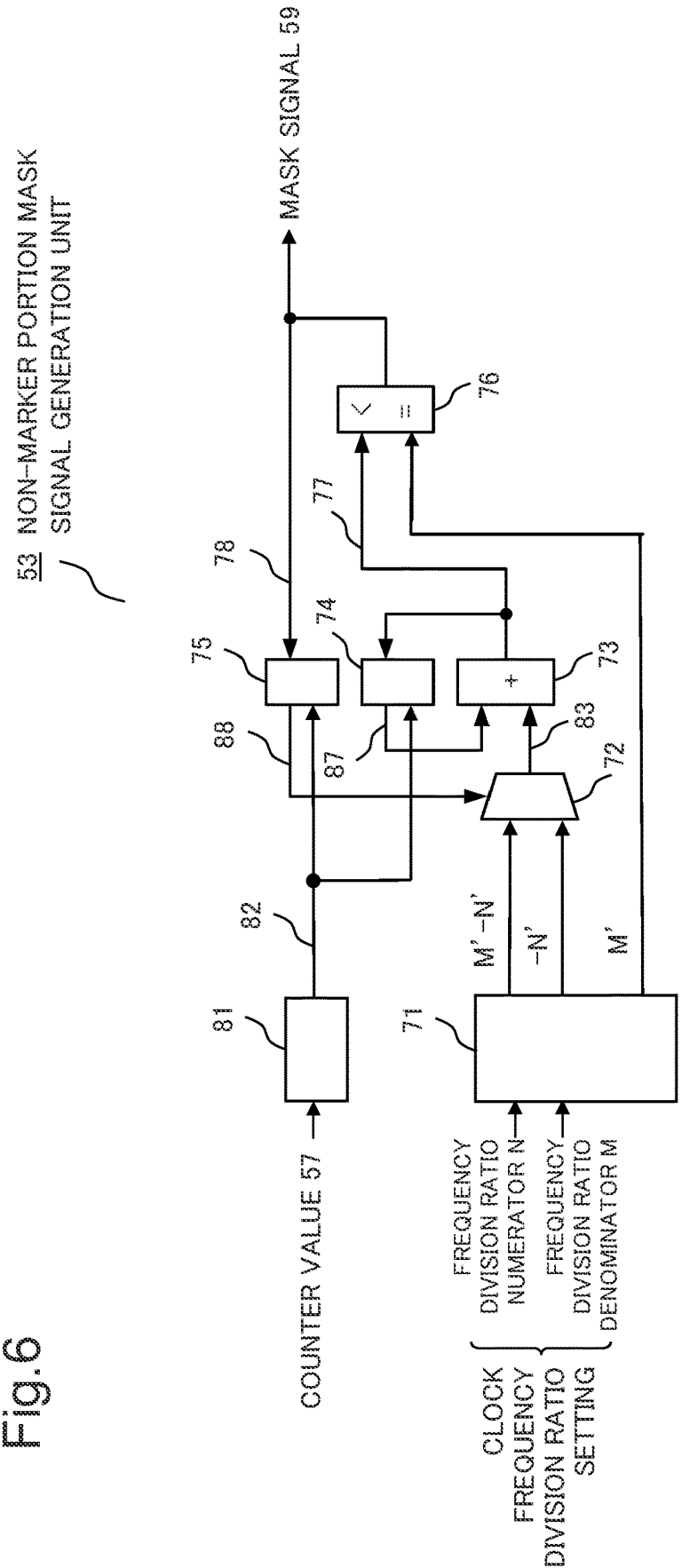
FIG. 6 is a diagram illustrating an example of a configuration of a non-marker portion mask signal generation unit according to the second example embodiment of the present disclosure.

FIG. 6 is a diagram illustrating an example of a configuration of the non-marker portion mask signal generation unit 53 according to the second example embodiment of the present disclosure. In the example illustrated in FIG. 6, the non-marker portion mask signal generation unit 53 includes a frequency division ratio setting conversion unit 71, a selector circuit 72, an adder 73, a storage circuit 74, a storage circuit 75, a magnitude comparator 76, and an initialization circuit 81. The input clock signal (for example, the clock S) is input to the non-marker portion mask signal generation unit 53. The non-marker portion mask signal generation unit 53 operates based on a timing of a rising edge of the input clock signal. However, in FIG. 6, a line representing the input clock signal is not drawn to avoid complication of the drawing.

The frequency division ratio setting (that is, the frequency division ratio denominator M and the frequency division ratio numerator N) is input to the frequency division ratio setting conversion unit 71. The frequency division ratio setting conversion unit 71 receives the frequency division ratio denominator M and the frequency division ratio numerator N. The frequency division ratio setting conversion unit 71 converts the input frequency division ratio denominator M and frequency division ratio numerator N into M' that is the length (that is, the number of cycles) of the non-marker portion and N' that is the number of unmasked clock pulses in the non-marker portion.

In the following description, as described above, a timing of an unmasked clock pulse in a period in which a phase relationship between frequency-divided clocks whose frequency division ratio is N'/M' completes one cycle, which is determined by a method of performing rational number frequency division, is set as a timing of an unmasked clock pulse in the non-marker portion. In this case, N'/M' is the frequency division ratio of the non-marker portion, M' is a frequency division ratio denominator M' of the non-marker portion, and N' is a frequency division ratio denominator N' of the non-marker portion. In this case, the conversion by the frequency division ratio setting conversion unit 71 can be rephrased as follows.

The frequency division ratio setting conversion unit 71 converts the input frequency division ratio denominator M and frequency division ratio numerator N into the frequency division ratio denominator M' and the frequency division ratio numerator N' of the frequency division ratio of the non-marker portion.

The frequency division ratio setting conversion unit 71 outputs the frequency division ratio denominator M' and the frequency division ratio numerator N' as a signal M'–N' representing the value of M'-N', a signal –N' representing the value of –N', and a signal M' representing the value of M'.

In a case where the length of the marker portion is three cycles, the value of the frequency division ratio denominator M' is M−3 (that is, the value of the frequency division ratio denominator M' is expressed as M'=M−3). The value of the frequency division ratio numerator N' is determined as follows according to a relationship between the value of M and the value of N.

In a case where N=M−1, the value of the frequency division ratio numerator N' is N−2 (that is, the value of the frequency division ratio numerator N' is expressed as N'=(N−2)).

In a case where M/2≤N and N<M−1, the value of the frequency division ratio numerator N' is N−1 (that is, the value of the frequency division ratio numerator N' is expressed as N'=(N−1)).

In a case where 2≤N and N<M/2, the value of the frequency division ratio numerator N' is N−2 (that is, the value of the frequency division ratio numerator N' is expressed as N'=(N−2)).

In a case where N=1, the value of the frequency division ratio numerator N' is N−1 (that is, the value of the frequency division ratio numerator N' is expressed as N'=(N−1)).

The counter value 57 (specifically, the signal representing the counter value 57) is input to the initialization circuit 81. The initialization circuit 81 receives the counter value 57. The counter value indicates the order of the cycle representing the current timing in a period of M cycles in which the phase relationship between the frequency-divided clocks completes one cycle. The initialization circuit 81 generates an initialization signal 82 for initializing the storage circuit 74 and the storage circuit 75 at a timing at which the non-marker portion starts in the period of M cycles in which the phase relationship between the frequency-divided clocks completes one cycle. In other words, the initialization circuit 81 generates the initialization signal 82 for initializing the storage circuit 74 and the storage circuit 75 in a case where the counter value 57 indicates the order of the cycle representing the timing at which the non-marker portion starts. For example, in a case where the counter value 57 does not indicate the order of the cycle representing the timing at which the non-marker portion starts, the initialization circuit 81 may set a value of a signal output as the initialization signal 82 to a value indicating that initialization is not performed. Then, in a case where the counter value 57 indicates the order of the cycle representing the timing at which the non-marker portion starts, the initialization circuit 81 may set the value of the signal output as the initialization signal 82 to a value indicating that initialization is performed.

The cycle of the timing at which the non-marker portion starts in the period of M cycles in which the phase relationship between the frequency-divided clocks completes one cycle illustrated in FIG. 4 is the cycle T3 (that is, the fourth cycle).

By initializing the storage circuit 74 and the storage circuit 75 at the timing of the cycle at which the non-marker portion starts in the period in which the phase relationship between the frequency-divided clocks completes one cycle, the mask signal of the non-marker portion is initialized at the timing of the cycle at which the non-marker portion starts. As a result, in the period in which the phase relationship between the frequency-divided clocks completes one cycle, the periodic mask signal of the non-marker portion starting from the timing of the cycle at which the non-marker portion starts is generated.

In the non-marker portion mask signal generation unit 53, a signal representing a value stored in the storage circuit 74 (hereinafter, referred to as an addition result 87) and an output of the selector circuit 72 described later (hereinafter, expressed as an addition value 83) are input to the adder 73. As described later, the selector circuit 72 outputs a signal (that is, the addition value 83) representing a value selected from the value of (M'−N') represented by the signal M'−N' and the value of (−N') represented by the signal –N'. The adder 73 calculates a result of addition of two values (that is, the value indicated by the addition result 87 and the value indicated by the addition value 83) represented by the two input signals, and outputs a signal representing the calculated result of addition (hereinafter, referred to as an addition result 77).

The signal representing the result of addition calculated by the adder 73 (that is, the addition result 77) is input to the storage circuit 74. The storage circuit 74 stores a value (that is, the result of addition described above) indicated by the input addition result 77. The storage circuit 74 outputs the signal (that is, the addition result 87 described above) representing the stored result of addition. The addition result 87 is input to the adder 73 described above. As described above, the signal representing the value stored in the storage circuit 74 and input to the adder 73 is the addition result 87. As described above, the initialization signal 82 is input from the initialization circuit 81 to the storage circuit 74. The storage circuit 74 is initialized by the initialization signal 82 at the timing at which the non-marker portion starts. In a case where the storage circuit 74 is initialized, the value stored in the storage circuit 74 becomes 0.

With the above configuration, the adder 73 outputs the signal (that is, the addition result 77) representing the result of addition of the value stored in the storage circuit 74 and the value indicating the signal output from the selector circuit 72. Then, the storage circuit 74 stores the result of addition of the value stored in the storage circuit 74 in the previous cycle and the value indicating the signal output from the selector circuit 72. That is, the adder 73 calculates a cumulative addition value that is a result of cumulative addition of values represented by signals output from the selector circuit 72 after the storage circuit 74 is initialized. The storage circuit 74 stores the cumulative addition value that is the result of cumulative addition of the values represented by the signals output from the selector circuit 72 after the storage circuit 74 is initialized.

In a case where the selector circuit 72 continues to select the value of (M'−N') after the storage circuit 74 is initialized, the storage circuit 74 stores a cumulative addition value of the values of (M'−N').

The signal representing the result of addition calculated by the adder 73 (the above-described addition result 77) is further input to the magnitude comparator 76. In addition, the signal representing the value of M' output by the frequency division ratio setting conversion unit 71 is input to the magnitude comparator 76. The magnitude comparator 76 receives the signal representing the result of addition (hereinafter, referred to as the addition result) calculated by the adder 73 and the signal representing the value of M'. The magnitude comparator 76 compares the result of addition calculated by the adder 73 with the value of M'. The magnitude comparator 76 outputs a signal (hereinafter, referred to as a comparison result 78) representing a result of comparison between the result of addition calculated by the adder 73 and the value of M' (hereinafter, referred to as a comparison result). In a case where the addition value is equal to or larger than the value of M', the magnitude comparator 76 sets a value of the comparison result 78 to a value (a predetermined value determined in advance) indicating that the addition value is equal to or larger than the value of M'. In a case where the addition value is smaller than the value of M', the magnitude comparator 76 sets the value of the comparison result 78 to a value (a predetermined value determined in advance) indicating that the addition value is smaller than the value of M'. The value indicating that the additional value is equal to or larger than the value of M' and the value indicating that the additional value is smaller than the value of M' are set in advance in such a way as to be different from each other.

The signal representing the comparison result output by the magnitude comparator 76 is input to the storage circuit 75. The storage circuit 75 receives the signal representing the comparison result output by the magnitude comparator 76. The storage circuit 75 stores the comparison result represented by the received signal. The storage circuit 75 outputs a signal representing the stored comparison result (hereinafter, referred to as a comparison result 88). The comparison result 88 output from the storage circuit 75 is input to the selector circuit 72.

As described above, the initialization signal 82 is input from the initialization circuit 81 to the storage circuit 75. The storage circuit 75 is initialized by the initialization signal 82 at the timing at which the non-marker portion starts. In a case where the storage circuit 75 is initialized, the value stored in the storage circuit 75 becomes 0. The signal indicating the value of (M'−N') and the signal indicating the value of (−N') are input to the selector circuit 72. The selector circuit 72 further receives the comparison result 88 output from the storage circuit 75, that is, the comparison result 88 which is a signal representing the result of comparison between the result of addition calculated by the adder 73 and the value of M'.

The selector circuit 72 selects one of the value of (M'−N') and the value of (−N') according to the value indicated by the comparison result 88 by referring to the comparison result 88. The selector circuit 72 outputs a signal indicating the selected value (hereinafter, referred to as the addition value 83). The addition value 83 output by the selector circuit 72 is input to the adder 73.

Specifically, in a case where the comparison result 88 is a value indicating that the result of addition calculated by the adder 73 is equal to or larger the value of M', that is, in a case where the result of addition calculated by the adder 73 is equal to or larger than the value of M', the selector circuit 72 selects the value of (−N'). The selector circuit 72 outputs the signal indicating the selected value (that is, the addition value 83).

In this case, the addition value 83 indicates the value of (−N'). Then, the addition value 83 indicating the value of (−N') is input to the adder 73. The adder 73 calculates a result of addition of the addition result stored in the storage circuit 74 and indicated by the input addition result 87 and the value of (−N') indicated by the input addition value 83. In other words, the adder 73 calculates a result of subtraction of the value of N' from the addition result stored in the storage circuit 74. The adder 73 outputs the addition result 77 representing the result of subtraction of the value of N' from the addition result stored in the storage circuit 74. The addition result 77 representing the result of subtraction of the value of N' from the addition result stored in the storage circuit 74 is input to the storage circuit 74 and the magnitude comparator 76.

In a case where the comparison result 88 is a value indicating that the result of addition calculated by the adder 73 is smaller than the value of M', that is, in a case where the result of addition calculated by the adder 73 is smaller than the value of M', the selector circuit 72 selects the value of (M'−N'). The selector circuit 72 outputs the signal indicating the selected value (that is, the addition value 83).

In this case, the addition value 83 indicates the value of (M'−N'). Then, the addition value 83 indicating the value of (M'−N') is input to the adder 73. The adder 73 calculates a result of addition of the addition result stored in the storage circuit 74 and indicated by the input addition result 87 and the value of (M'−N') indicated by the input addition value 83. The adder 73 outputs the addition result 77 representing a result of addition of the addition result stored in the storage circuit 74 and the value of (M'−N'). The addition result 77 representing the result of addition of the addition result stored in the storage circuit 74 and the value of (M'−N') is input to the storage circuit 74 and the magnitude comparator 76. While the result of addition calculated by the adder 73 is smaller than the value of M', the adder 73 repeats addition of the value of (M'−N') and the addition result stored in the storage circuit 74 for each cycle.

As described above, the addition result 77 representing the result of addition calculated by the adder and the signal representing the value of M' are input to the magnitude comparator 76. As described above, the magnitude comparator 76 outputs the signal (that is, the comparison result 78) representing the result of comparison between the result of addition calculated by the adder and the value of M'. In a case where the result of addition calculated by the adder is equal to or larger than the value of M', the magnitude comparator 76 outputs the signal representing the value indicating that the result of addition calculated by the adder is equal to or larger than the value of M' as the comparison result 78. In a case where the result of addition calculated by the adder is smaller than the value of M', the magnitude comparator 76 outputs the signal representing the value indicating that the result of addition calculated by the adder is smaller than the value of M' as the comparison result 78.

In the present example embodiment, the value indicating that the result of addition calculated by the adder is equal to or larger than the value of M' is a value (for example, 1) indicating that masking is performed. The value indicating that the result of addition calculated by the adder is smaller than the value of M' is a value (for example, 0) indicating that masking is not performed. The non-marker portion mask signal generation unit 53 outputs the comparison result 78 of such values output by the magnitude comparator 76 as the mask signal 59. The comparison result 78 of the values as described above output by the magnitude comparator 76 is used as the mask signal 59. In other words, the magnitude comparator 76 also outputs the comparison result 78 of the values as described above as the mask signal 59. In a case where the value of the mask signal 59 is 1, the mask circuit 61 that has received the mask signal 59 executes mask processing of masking the clock pulse of the clock S. In a case where the value of the mask signal 59 is 0, the mask circuit 61 that has received the mask signal 59 does not execute the mask processing of masking the clock pulse of the clock S.

The frequency-divided clock masked by the non-marker portion mask signal generated by the non-marker portion mask signal generation unit 53 according to the present example embodiment described above has the following characteristics. In the following description, the input frequency division ratio setting is represented by the frequency division ratio denominator M and the frequency division ratio numerator N. The frequency division ratio denominator M in this case is, for example, 12.

In a case where $N=M-1$, the clock pulse is not masked in the non-marker portion. Therefore, in the target circuit operating with the generated frequency-divided clock, the marker portion including the cycle in which the clock pulse is masked can be easily detected.

In a case where $M/2 \leq N$ and $N<M-1$, the clock pulses of two consecutive cycles are not masked in the non-marker portion. Therefore, in the target circuit operating with the generated frequency-divided clock, the marker portion including two consecutive cycles in which the clock pulses are masked can be easily detected.

In a case where $2 \leq N$ and $N<M/2$, there is no timing at which the clock pulses of two consecutive cycles are not masked in the non-marker portion. Therefore, in the target circuit operating with the generated frequency-divided clock, the marker portion including two consecutive cycles in which the clock pulses are not masked can be easily detected.

In a case where $N=1$, there is no timing at which the clock pulse is not masked in the non-marker portion. Therefore, in the target circuit operating with the generated frequency-divided clock, the marker portion including the cycle in which the clock pulse is not masked can be easily detected.

Next, a process in which the clock signal frequency dividing circuit 10 according to the second example embodiment of the present disclosure generates the frequency-divided clocks will be described in detail with reference to the drawings.

Figure 7:
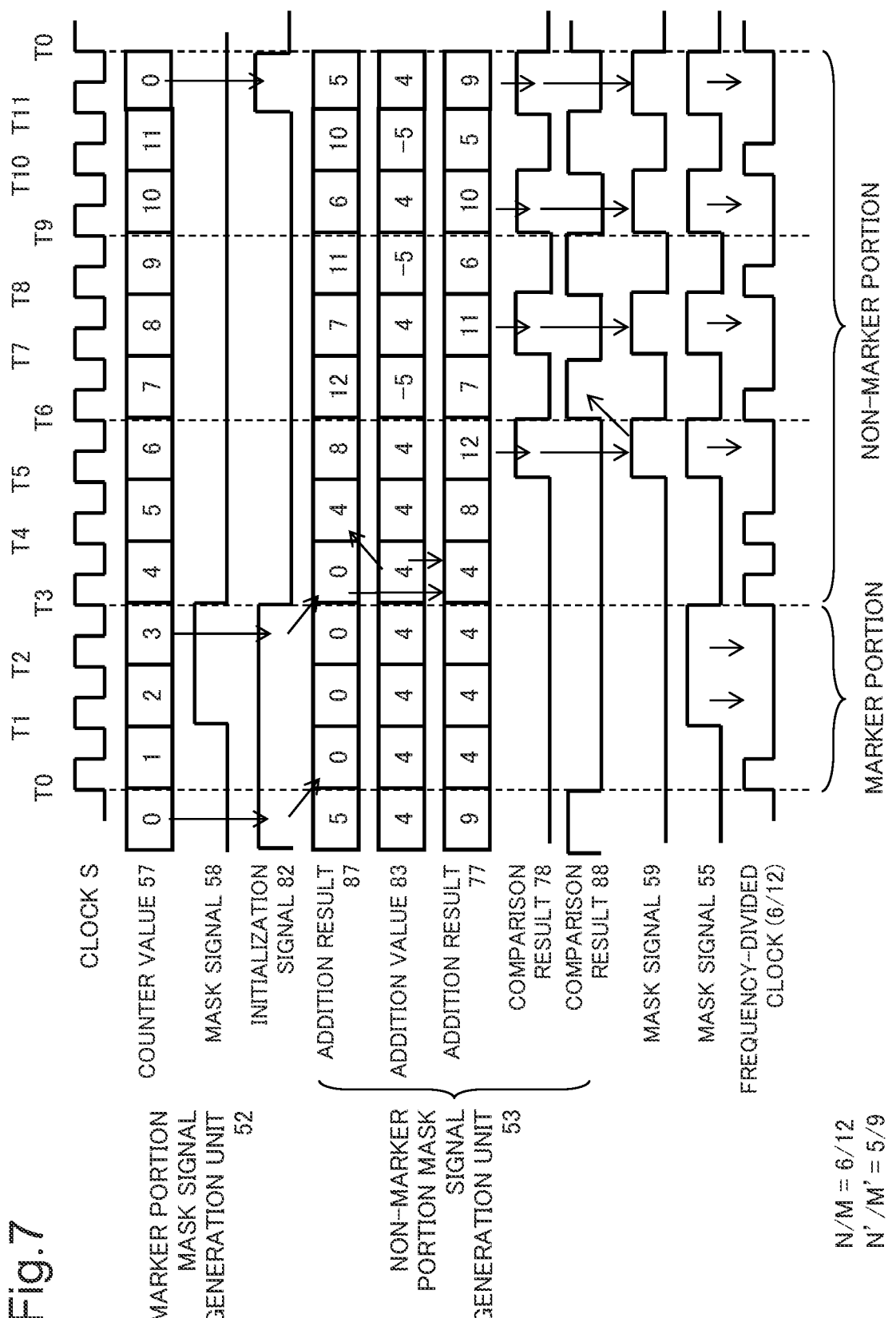
FIG. 7 is a diagram illustrating an example of a value of a signal output from an element included in the clock signal frequency dividing circuit in each cycle of a period in which a phase relationship between frequency-divided clocks completes one cycle.

FIG. 7 is a diagram illustrating an example of a value of a signal output from an element included in the clock signal frequency dividing circuit 10 in each cycle of the period in which the phase relationship between the frequency-divided clocks completes one cycle. FIG. 7 illustrates transitions of values of the clock S and the signal output from the element included in the clock signal frequency dividing circuit 10 in a case where the frequency division ratio is 6/12.

In the example illustrated in FIG. 7, the pattern of the clock pulses of the frequency-divided clocks generated by the clock signal frequency dividing circuit 10 completes one cycle in $M=12$ cycles. In FIG. 7, 12 cycles in which the pattern completes one cycle are represented as cycles T0 to T11.

A portion of three cycles of the cycles T0 to T2 of the output frequency-divided clock signal is the marker portion. The marker portion mask signal generation unit 52 generates the mask signal of the marker portion and outputs the generated mask signal as the mask signal 58. Specifically, in a case where the frequency division ratio is 6/12, $M/2 \leq N$ and $N<M-1$. The marker portion in this case is the marker portion 12. Therefore, the marker portion mask signal generation unit 52 generates a mask signal for generating the clock pulse of the marker portion 12, and outputs the generated mask signal as the mask signal 58. The mask signal for generating the clock pulse of the marker portion 12 is a mask signal in which a value in the cycle T0 is 0, which is a value indicating that the clock pulse is not masked, and values in the cycles T1 and T2 are 1, which is a value indicating that the clock pulse is masked.

A portion of nine cycles of the cycles T3 to T11 of the output frequency-divided clock signal is the non-marker portion. The non-marker portion mask signal generation unit 53 generates a mask signal of the portion of nine cycles of the cycles T3 to T11, and outputs the generated mask signal as the mask signal 59. In a case where the frequency division ratio is 6/12, $M/2 \leq N$ and $N<M-1$. In this case, the non-marker portion mask signal generation unit 53 converts the input frequency division ratio $N/M=6/12$ into the frequency division ratio $N'/M'=(N-1)/(M-3)=5/9$ of the non-marker portion. The non-marker portion mask signal generation unit 53 generates the mask signal in such a way that the mask signal of the non-marker portion is the same as a portion of a mask signal for generating the frequency-divided clocks obtained by rational number frequency division in a case where the frequency division ratio is $N'/M'$, the portion being associated to the period in which the phase relationship between the frequency-divided clocks completes one cycle.

The initialization circuit 81 included in the non-marker portion mask signal generation unit 53 initializes the storage circuits 74 and 75 in the cycles T0 to T2 of the marker portion and T3 which is the first cycle of the non-marker portion. Therefore, the initialization circuit 81 outputs the initialization signal 82 having a value of 1 in the cycles T11 to T2 immediately before these cycles. As a result, the value of the addition result 87, which is the output of the storage circuit 74, and the value of the comparison result 88, which is the output of the storage circuit 75, become 0 by the initialization in the cycles T0 to T3.

The value of the comparison result 88 is 0 in the cycle T3. Therefore, the selector circuit 72 selects $M'-N'=4$ (that is, 4 as the value of $M'-N'$), and outputs the addition value 83 having a value of 4.

The adder 73 outputs the addition result 77 having a value of 4 that is a result of addition of 4 that is the value of the addition value 83 and 0 that is the value of the addition result 87.

The magnitude comparator 76 compares 4 that is the value of the addition result 77 with $M'=9$ (that is, 9 as the value of $M'$). Since the value of the addition result 77 is $<M'$, the magnitude comparator 76 outputs the comparison result 78 having a value of 0, which is a value representing the comparison result. As a result, the mask signal 59 having a value of 0 is output.

In addition, the storage circuit 74 stores 4 that is the value of the addition result 77, and the storage circuit 75 stores 0 that is the value of the comparison result 78.

Similarly, the value of the comparison result 88 is 0 in the cycle T4. Therefore, the selector circuit 72 selects $M'-N'=4$ (that is, 4 as the value of $M'-N'$), and outputs the addition value 83 having the selected value of 4.

The adder 73 outputs the addition result 87 having a value of 8 that is a result of addition of 4 that is the value of the addition value 83 and 4 that is the value of the addition result 77.

The magnitude comparator 76 compares 8 that is the value of the addition result 77 with M'=9 (that is, 9 as the value of M'). Since the value of the addition result 77 is <M', the magnitude comparator 76 outputs the comparison result 78 having a value of 0, which is a value representing the comparison result. As a result, the mask signal 59 having a value of 0 is output.

In addition, the storage circuit 74 stores 8 that is the value of the addition result 77, and the storage circuit 75 stores 0 that is the value of the comparison result 78.

The value of the comparison result 88 is 0 in the cycle T5. Therefore, the selector circuit 72 selects M'−N'=4 (that is, 4 as the value of M'−N'), and outputs the addition value 83 having the selected value of 4.

The adder 73 outputs the addition result 77 having a value of 12 that is a value of a result of addition of 4 that is the value of the addition value 83 and 8 that is the value of the addition result 87.

The magnitude comparator 76 compares 12 that is the value of the addition result 77 with M'=9 (that is, 9 as the value of M'). Since the value of the addition result 77 is ≥M', the magnitude comparator 76 outputs the comparison result 78 having a value of 1, which is a value representing the comparison result. As a result, the mask signal 59 having a value of 1 is output.

In addition, the storage circuit 74 stores 12 that is the value of the addition result 77, and the storage circuit 75 stores 1 that is the value of the comparison result 78.

The value of the comparison result 88 is 1 in the cycle T6. Therefore, the selector circuit 72 selects −N'=−5 (that is, 5 as the value of −N'), and outputs the addition value 83 having the selected value of −5.

The adder 73 outputs the addition result 77 having a value of 7 that is a value of a result of addition of −5 that is the value of the addition value 83 and 12 that is the value of the addition result 87.

The magnitude comparator 76 compares 7 that is the value of the addition result 77 with M'=9 (that is, 9 as the value of M'). Since the value of the addition result 77 is <M', the magnitude comparator 76 outputs the comparison result 78 having a value of 0, which is a value representing the comparison result. As a result, the mask signal 59 having a value of 0 is output.

In addition, the storage circuit 74 stores 7 that is the value of the addition result 77, and the storage circuit 75 stores 0 that is the value of the comparison result 78.

The value of the comparison result 88 is 0 in the cycle T7. Therefore, the selector circuit 72 selects M'−N'=4 (that is, 4 as the value of M'−N'), and outputs the addition value 83 having the selected value of 4.

The adder 73 outputs the addition result 77 having a value of 11 that is a value of a result of addition of 4 that is the value of the addition value 83 and 7 that is the value of the addition result 87.

The magnitude comparator 76 compares 11 that is the value of the addition result 77 with M'=9 (that is, 9 as the value of M'). Since the value of the addition result 77 is ≥M', the magnitude comparator 76 outputs the comparison result 78 having a value of 1, which is a value representing the comparison result. As a result, the mask signal 59 having a value of 1 is output.

In addition, the storage circuit 74 stores 11 that is the value of the addition result 77, and the storage circuit 75 stores 1 that is the value of the comparison result 78.

The value of the comparison result 88 is 1 in the cycle T8. Therefore, the selector circuit 72 selects −N'=−5 (that is, 5 as the value of −N'), and outputs the addition value 83 having the selected value of −5.

The adder 73 outputs the addition result 77 having a value of 6 that is a value of a result of addition of −5 that is the value of the addition value 83 and 11 that is the value of the addition result 87.

The magnitude comparator 76 compares 6 that is the value of the addition result 77 with M'=9 (that is, 9 as the value of M'). Since the value of the addition result 77 is <M', the magnitude comparator 76 outputs the comparison result 78 having a value of 0, which is a value representing the comparison result. As a result, the mask signal 59 having a value of 0 is output.

In addition, the storage circuit 74 stores 6 that is the value of the addition result 77, and the storage circuit 75 stores 0 that is the value of the comparison result 78.

The value of the comparison result 88 is 0 in the cycle T9. Therefore, the selector circuit 72 selects M'−N'=4 (that is, 4 as the value of M'−N'), and outputs the addition value 83 having a value of 4.

The adder 73 outputs the addition result 77 having a value of 10 that is a value of a result of addition of 4 that is the value of the addition value 83 and 6 that is the value of the addition result 87.

The magnitude comparator 76 compares 10 that is the value of the addition result 77 with M'=9 (that is, 9 as the value of M'). Since the value of the addition result 77 is ≥M', the magnitude comparator 76 outputs the comparison result 78 having a value of 1, which is a value representing the comparison result. As a result, the mask signal 59 having a value of 1 is output.

In addition, the storage circuit 74 stores 10 that is the value of the addition result 77, and the storage circuit 75 stores 1 that is the value of the comparison result 78.

The value of the comparison result 88 is 1 in the cycle T10. Therefore, the selector circuit 72 selects −N'=−5 (that is, 5 as the value of −N'), and outputs the addition value 83 having the selected value of −5.

The adder 73 outputs the addition result 77 having a value of 5 that is a value of a result of addition of −5 that is the value of the addition value 83 and 10 that is the value of the addition result 87.

The magnitude comparator 76 compares 5 that is the value of the addition result 77 with M'=9 (that is, 9 as the value of M'). Since the value of the addition result 77 is <M', the magnitude comparator 76 outputs the comparison result 78 having a value of 0, which is a value representing the comparison result. As a result, the mask signal 59 having a value of 0 is output.

In addition, the storage circuit 74 stores 5 that is the value of the addition result 77, and the storage circuit 75 stores 0 that is the value of the comparison result 78.

The value of the comparison result 88 is 0 in the cycle T11. Therefore, the selector circuit 72 selects M'−N'=4 (that is, 4 as the value of M'−N'), and outputs the addition value 83 having the selected value of 4.

The adder 73 outputs the addition result 77 having a value of 9 that is a value of a result of addition of 4 that is the value of the addition value 83 and 5 that is the value of the addition result 87.

The magnitude comparator 76 compares 9 that is the value of the addition result 77 with M'=9 (that is, 9 as the value of M'). Since the value of the addition result 77 is ≥M', the magnitude comparator 76 outputs the comparison result 78 having a value of 1, which is a value representing the comparison result. As a result, the mask signal 59 having a value of 1 is output.

Since the value of the initialization signal 82 is 1, which is a value indicating initialization, the storage circuit 74 and the storage circuit 75 store 0 as a value.

By the above operation, the non-marker portion mask signal generation unit 53 outputs the mask signal indicating 1, which is a value indicating masking of the clock pulse, in the cycles T5, T7, T9, and T11 among the cycles T3 to T11 of the non-marker portion. In the other cycles T3, T4, T6, T8, and T10, the non-marker portion mask signal generation unit 53 outputs a mask signal indicating 0, which is a value indicating that the clock pulse is not masked.

The selection circuit 54 included in the clock signal frequency dividing circuit 10 selects the mask signal 58 output from the marker portion mask signal generation unit 52 in the cycles T0 to T2 of the marker portion, and outputs the selected mask signal 58 as the mask signal 55. In the cycles T3 to T11 of the non-marker portion, the selection circuit 54 selects the mask signal 59 output from the non-marker portion mask signal generation unit 53, and outputs the selected mask signal 59 as the mask signal 55. Therefore, the value of the output mask signal 55 is 1, which is a value indicating masking of the clock pulse, in the cycles T1, T2, T5, T7, T9, and T11, and is 0, which is a value indicating that the clock pulse is not masked, in the other cycles.

The mask circuit 61 masks the clock pulse of the input clock S according to the mask signal 55 by referring to the mask signal 55. Specifically, the mask circuit 61 masks the clock pulse of the clock S in the cycles T1, T2, T5, T7, T9, and T11, and does not mask the clock pulse of the clock S in the other cycles. As a result, the frequency-divided clocks with the frequency division ratio N/M=6/12, in which the clock pulse is masked in six cycles among 12 cycles in which the frequency division pattern completes one cycle, is output.

(Effects)

As described above, in the present example embodiment, the clock signal is generated by masking the clock pulse in consideration of the timing of communication. Therefore, any rational number frequency division of the clock signal is implemented with low power, low area, and low design cost. Furthermore, a special timing design or a special clock transfer circuit is not required for communication with another circuit operating with a clock signal of a different frequency. Therefore, the clock signal frequency dividing circuit 10 according to the present example embodiment can generate a clock signal capable of efficiently performing communication between circuits operating with different clocks.

Furthermore, each circuit block operating with the frequency-divided clock output from the clock signal frequency dividing circuit can easily specify the start of the period in which the phase relationship between the frequency-divided clocks completes one cycle. Therefore, each circuit block can easily specify the timing of communication between the circuit blocks. In addition, each circuit block does not need to separately propagate information indicating the timing of communication between the circuit blocks. As a result, effects of facilitating the timing design of the circuit, shortening a circuit development period, and reducing the circuit scale and power consumption can be obtained.

Schematic Example of Second Example Embodiment

Next, a schematic example of the second example embodiment, which is an example schematically representing the second example embodiment, will be described in detail with reference to the drawings. Elements described below in the present schematic example operate similarly to the corresponding elements of the second example embodiment. In addition, among the elements of the present schematic example, elements given the same names and the same reference numerals as the elements in the first example embodiment operate similarly to the elements in the first example embodiment.

FIG. 12 is a diagram schematically illustrating an example of a configuration of a processing system according to the second example embodiment of the present disclosure. In the example illustrated in FIG. 12, a processing system 1001 includes a clock signal frequency divider 1010A, a clock signal frequency divider 1010B, a processing device 2000A, and a processing device 2000B.

The clock signal frequency divider 1010A corresponds to the clock signal frequency dividing circuit 10*a* of the second example embodiment. The clock signal frequency divider 1010B corresponds to the clock signal frequency dividing circuit 10*b* of the second example embodiment. The processing device 2000A corresponds to the circuit A of the second example embodiment. The processing device 2000B corresponds to the circuit B of the second example embodiment. A frequency division ratio setting A, a clock S, and communication timing information are input to the clock signal frequency divider 1010A. A frequency division ratio setting B, the clock S, and the communication timing information are input to the clock signal frequency divider 1010A. The frequency division ratio setting A corresponds to the frequency division ratio setting 30*a* of the second example embodiment. The frequency division ratio setting B corresponds to the frequency division ratio setting 30*b* of the second example embodiment. The clock S corresponds to the clock S of the second example embodiment. The clock S input to the clock signal frequency divider 1010A and the clock S input to the clock signal frequency divider 1010B are the same signal. The clock signal frequency divider 1010A and the clock signal frequency divider 1010B are also collectively referred to as a clock signal frequency divider 1010.

A signal indicating information input to the clock signal frequency divider 1010A, the clock signal frequency divider 1010B, the processing device 2000A, and the processing device 2000B is input by, for example, another device mounted on the processing system 1001.

The clock signal frequency divider 1010A outputs a clock A. The clock signal frequency divider 1010B outputs a clock B. The clock A corresponds to the clock A of the second example embodiment. The clock B corresponds to the clock B of the second example embodiment.

The communication timing information is, for example, a signal indicating a timing of a start of a period in which a phase relationship between the clock A and the clock B completes one cycle. The clock signal frequency divider 1010A generates the clock A in such a way that the timing of the start indicated by the communication timing information becomes the timing of the start of the period in which the phase relationship between the clock A and the clock B completes one cycle in the clock A. The clock signal frequency divider 1010B generates the clock B in such a way that the timing of the start indicated by the communication timing information becomes the timing of the start of the period in which the phase relationship between the clock A and the clock B completes one cycle in the clock B. In the second example embodiment, the communication timing information may be a signal for resetting the counter value of the counter circuit 56 (that is, setting the counter value stored in the counter circuit to 0). For example, the counter circuit 56 of the clock signal frequency dividing circuit 10*a* of the second example embodiment and the counter circuit 56 of the clock signal frequency dividing circuit 10*a* of the second example embodiment may receive the communication timing information indicating a value indicating resetting of the counter value at the same timing at the start of operation, and reset the counter value of the counter circuit 56 at the same timing.

The clock A, the frequency division ratio setting A, and the frequency division ratio setting B are input to the processing device 2000A. The clock B, the frequency division ratio setting A, and the frequency division ratio setting B are input to the processing device 2000B. The processing device 2000A and the processing device 2000B communicate with each other.

Figure 13:
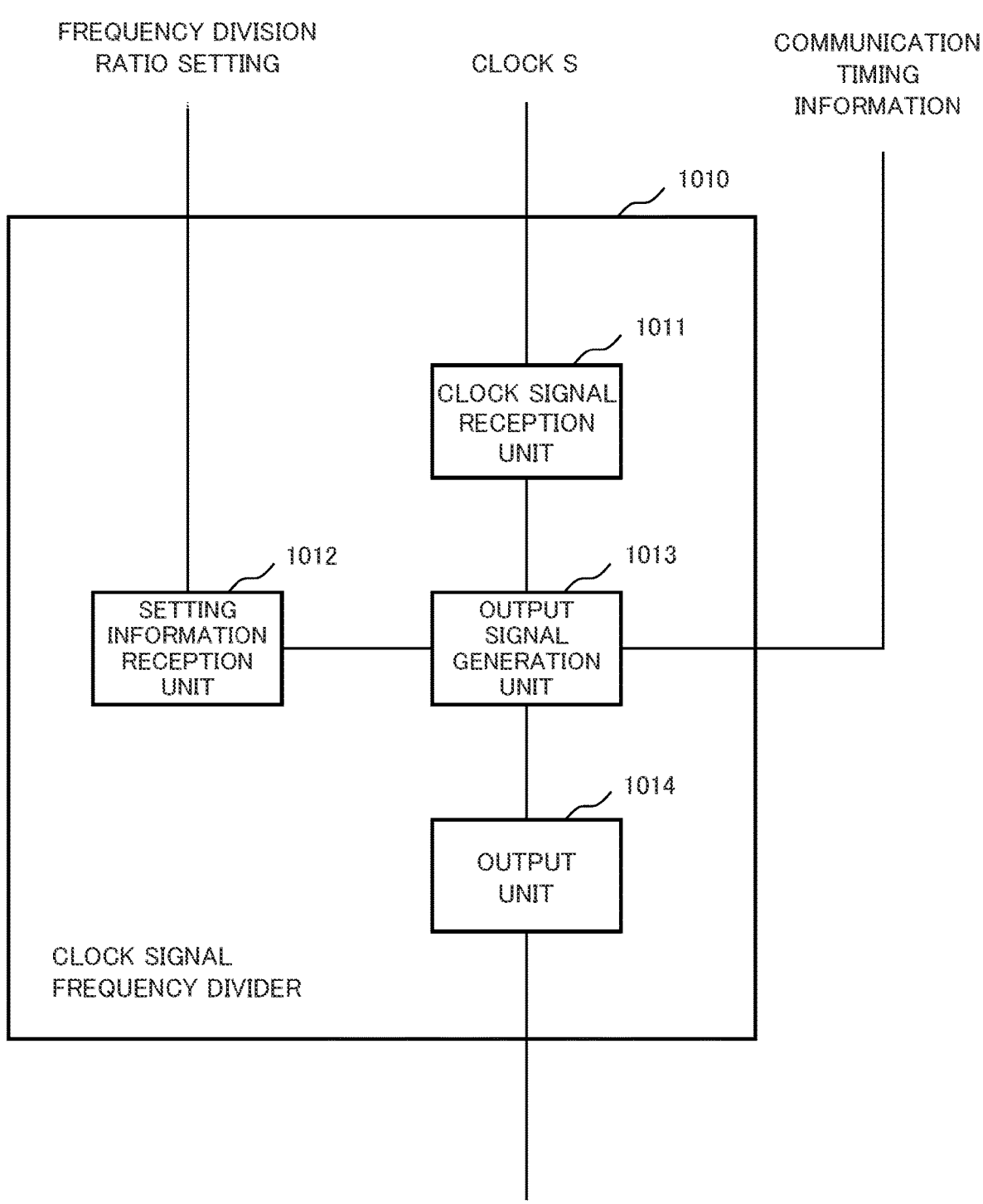
FIG. 13 is a block diagram illustrating an example of a configuration of a clock signal frequency divider according to the second example embodiment of the present disclosure.

FIG. 13 is a block diagram illustrating an example of a configuration of the clock signal frequency divider 1010 according to the second example embodiment of the present disclosure. In the example illustrated in FIG. 13, the clock signal frequency divider 1010 includes a clock signal reception unit 1011, a setting information reception unit 1012, an output signal generation unit 1013, and an output unit 1014.

The clock signal reception unit 1011 receives an input clock signal (that is, the clock S). The clock signal reception unit 1011 is associated to a signal line of the clock signal frequency dividing circuit 10 of the second example embodiment through which the clock S is input.

The setting information reception unit 1012 receives the frequency division ratio setting. The setting information reception unit 1012 is associated to a signal line of the clock signal frequency dividing circuit 10 of the second example embodiment through which the frequency division ratio setting (that is, the frequency division ratio denominator M and the frequency division ratio numerator N) is input. A length of the period in which the phase relationship between the clock A and the clock B completes one cycle, that is, the number of cycles, is set as the value of the frequency division ratio denominator M. The value of the frequency division ratio numerator N is set in such a way that the frequency division ratio is N/M in a case where the value of the frequency division ratio denominator M is the length of the period in which the phase relationship between the clock A and the clock B completes one cycle.

The output unit 1014 outputs an output clock signal (that is, the clock A or the clock B of the second example embodiment). The output unit 1014 is associated to a signal line of the clock signal frequency dividing circuit 10 of the second example embodiment through which the output clock signal (that is, the clock A or the clock B of the second example embodiment) is output.

The output signal generation unit 1013 operates similarly to the clock signal frequency dividing circuit 10 of the second example embodiment. As described above, the output signal generation unit 1013 generates the output clock signal in which a periodic pattern signal is repeated from a pulse of the received input clock signal. The periodic pattern signal is a signal in which pulses of the mask pulse number smaller than the periodic pulse number among consecutive pulses of the periodic pulse number are masked. Then, the periodic pattern signal includes a marker portion including at least one unmasked pulse at a start portion of the periodic pattern signal. The mask pulse number is a value obtained by subtracting the frequency division ratio numerator N from the frequency division ratio denominator M.

The marker portion is the same as the marker portion of the second example embodiment. The periodic pattern signal is a signal of a portion of the output clock signal associated to the length of the period in which the phase relationship between the clock A and the clock B completes one cycle from the start of the period in which the phase relationship between the clock A and the clock B completes one cycle. For example, the output signal generation unit 1013 may set the timing indicated by the communication timing information as a timing of the start of the first periodic pattern signal of the period in which the phase relationship between the clock A and the clock B completes one cycle.

The non-marker portion is a portion other than the marker portion of the periodic pattern signal. The non-marker portion is the same as the marker portion of the second example embodiment.

The output signal generation unit 1013 is associated to a portion of the clock signal frequency dividing circuit 10 of the second example embodiment other than the signal line through which the clock S is input, the signal line through which the frequency division ratio setting is input, and the signal line through which the output clock signal is output.

FIG. 14 is a diagram illustrating an example of a configuration of the output signal generation unit 1013 according to the schematic example of the second example embodiment of the present disclosure. In the example illustrated in FIG. 14, the output signal generation unit 1013 includes a mask control unit 1051 and a mask unit 1061. The mask control unit 1051 corresponds to the mask control circuit 51 and the counter circuit 56 of the second example embodiment. The mask control unit 1051 operates similarly to the mask control circuit 51 of the second example embodiment. The mask unit 1061 corresponds to the mask circuit 61 of the second example embodiment. The mask unit 1061 operates similarly to the mask circuit 61 of the second example embodiment.

The mask control unit 1051 receives the input clock signal (that is, the clock S), the frequency division ratio setting, and the communication timing information. The mask control unit 1051 operates with the clock S.

The mask control unit 1051 determines whether to mask each pulse of the input clock signal from the periodic pulse number and an unmasked pulse number, which is the number of pulses that are not masked, and generates a mask signal indicating the determination result. The periodic pulse number is the above-described frequency division ratio denominator M. The unmasked pulse number is the above-described frequency division ratio numerator N. The mask control unit 1051 outputs the mask signal.

The input clock signal (that is, the clock S) and the mask signal are input to the mask unit 1061.

The mask unit 1061 masks the pulse determined to be masked according to the mask signal, and outputs the pulse not determined to be masked as it is.

Figure 15:
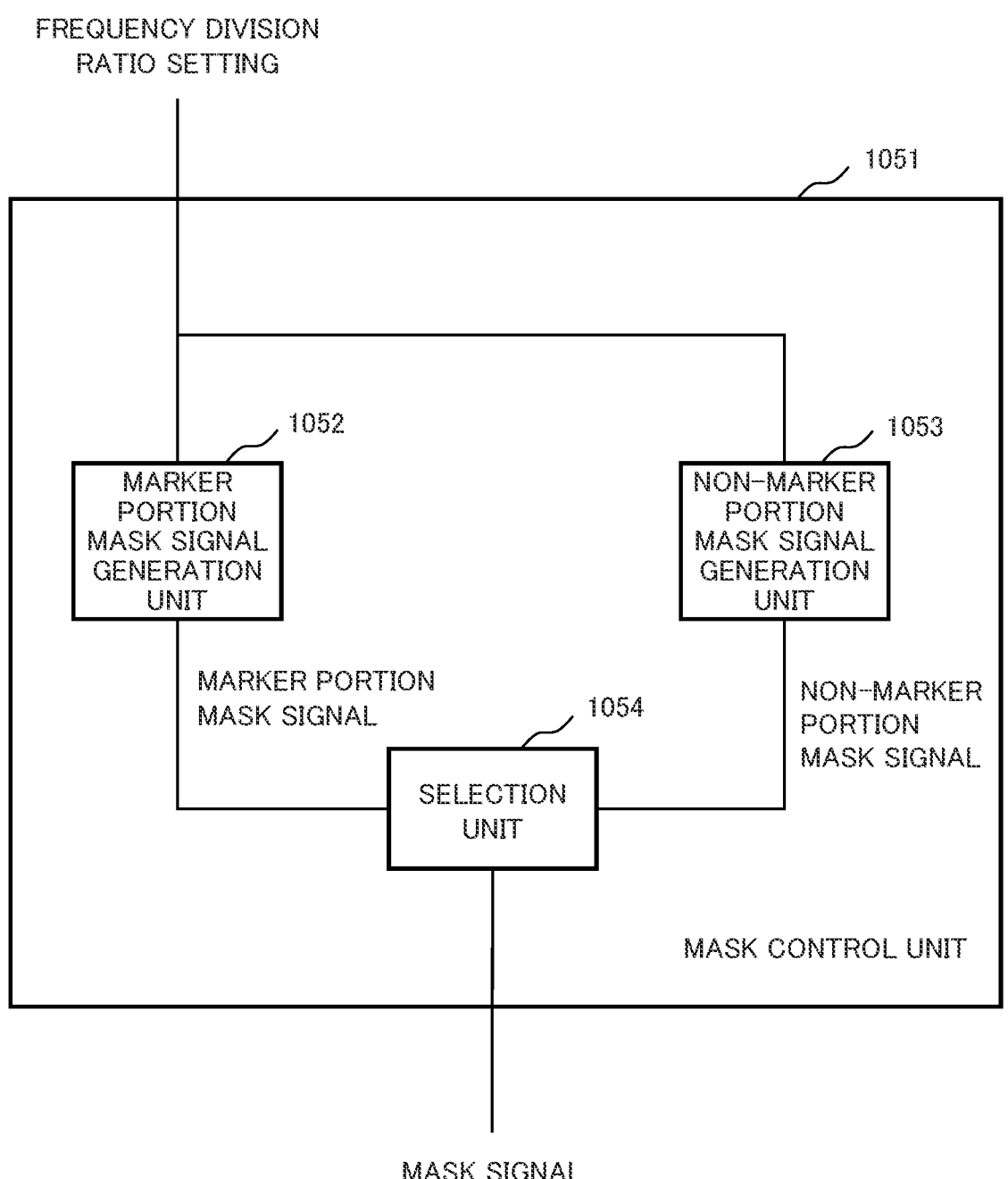
FIG. 15 is a diagram illustrating an example of a configuration of a mask control unit according to the schematic example of the second example embodiment of the present disclosure.

FIG. 15 is a diagram illustrating an example of a configuration of the mask control unit 1051 according to the schematic example of the second example embodiment of the present disclosure. In the example illustrated in FIG. 15, the mask control unit 1051 includes a marker portion mask signal generation unit 1052, a non-marker portion mask signal generation unit 1053, and a selection unit 1054. FIG. 15 illustrates portions of the mask control unit 1051 corresponding to the marker portion mask signal generation unit 52, the non-marker portion mask signal generation unit 53, and the selection circuit 54 of the mask control circuit 51 of the second example embodiment. The marker portion mask signal generation unit 1052, the non-marker portion mask signal generation unit 1053, and the selection unit 1054 operate with the input clock S. However, the signal line of the clock S is not illustrated in FIG. 15 to avoid complication of the drawing.

The frequency division ratio setting is input to the marker portion mask signal generation unit 1052 and the non-marker portion mask signal generation unit 1053.

The marker portion mask signal generation unit 1052 generates a marker portion mask signal which is a mask signal of the marker portion determined from the periodic pulse number and the unmasked pulse number. A method of generating the marker portion mask signal by the marker portion mask signal generation unit 1052 is the same as the method of generating the marker portion mask signal by the marker portion mask signal generation unit 52 according to the second example embodiment.

The non-marker portion mask signal generation unit 1053 generates a non-marker portion mask signal which is a mask signal of the non-marker portion in such a way that a pattern of the unmasked pulse of the non-marker portion which is a portion other than the marker portion of the periodic pattern signal becomes the same as a second frequency division pattern. The second frequency division pattern is a pattern of the unmasked pulse of the periodic clock signal in a case where rational number frequency division is performed with the frequency division ratio determined from a second periodic pulse number and a second number of non-masked pulses. The rational number frequency division in this case is rational number frequency division according to any of the existing rational number frequency division algorithms. The second periodic pulse number is the number of pulses obtained by subtracting the number of pulses of the marker portion from the periodic pulse number. The second unmasked pulse number is the number of pulses obtained by subtracting the unmasked pulse number included in the marker portion from the unmasked pulse number. A method of generating the non-marker portion mask signal by the non-marker portion mask signal generation unit 1053 is the same as the method of generating the non-marker portion mask signal by the non-marker portion mask signal generation unit 53 according to the second example embodiment.

The selection unit 1054 outputs the marker portion mask signal as the mask signal while outputting the marker portion of the periodic pattern signal, and outputs the non-marker portion mask signal as the mask signal while outputting the non-marker portion of the periodic pattern signal. In other words, the selection unit 1054 selects the marker portion mask signal as the mask signal while outputting the marker portion of the periodic pattern signal, and selects the non-marker portion mask signal as the mask signal while outputting the non-marker portion of the periodic pattern signal. The selection unit 1054 outputs, as the mask signal, the signal selected as the mask signal. A method of selecting the marker portion mask signal or the non-marker portion mask signal as the signal to be output as the mask signal by the selection unit 1054 is the same as the method of method of selecting the marker portion mask signal or the non-marker portion mask signal as the signal to be output as the mask signal by the selection circuit 54.

In a case where an output pulse number obtained by subtracting the mask pulse number from the periodic pulse number is a value obtained by subtracting 1 from the periodic pulse number, $N=M-1$. In a case where the output pulse number is two or more and the output pulse number is smaller than a value obtained by dividing the periodic pulse number by 2, $2 \le N$ and $N < M/2$. In these cases, the marker portion includes unmasked pulses at two consecutive output clock timings, which are timings at which pulses are output as output clock signals in a case where the pulses are not masked. The non-marker portion does not include unmasked pulses at two consecutive output clock timings.

In a case where the output pulse number is equal to or larger than a value obtained by dividing the periodic pulse number by 2 and the output pulse number is smaller than a value obtained by subtracting 1 from the periodic pulse number, $M/2 \le N$ and $N < M-1$. In addition, in a case where the output pulse number is one, $N=1$. In these cases, pulses at at least two consecutive output clock timings are masked in the marker portion, and pulses at two consecutive output clock timings are not masked in the non-marker portion.

The processing device 2000A and the processing device 2000B have the same schematic configuration. A device having the same schematic configuration of the processing device 2000A and the processing device 2000B is referred to as a processing device 2000. However, frequencies of clock signals at which the processing device 2000A and the processing device 2000B are driven are different. Hereinafter, the output clock signal (that is, the clock A) output from the output unit 1014 of the clock signal frequency divider 1010A to the processing device 2000A is also referred to as a first output clock signal. The output clock signal (that is, the clock B) output from the output unit 1014 of the clock signal frequency divider 1010B to the processing device 2000B is also referred to as a second output clock signal. The first output clock signal is different from the second output clock signal. Specifically, the frequency division ratio of the first output clock signal is different from the frequency division ratio of the second output clock signal. However, a start clock timing, which is the first timing among timings at which the pulses are output as the output clock signals in a case where the pulses are not masked, of the marker portion of the first output clock signal is the same as the clock timing of the marker portion of the second output clock signal.

Figure 16:
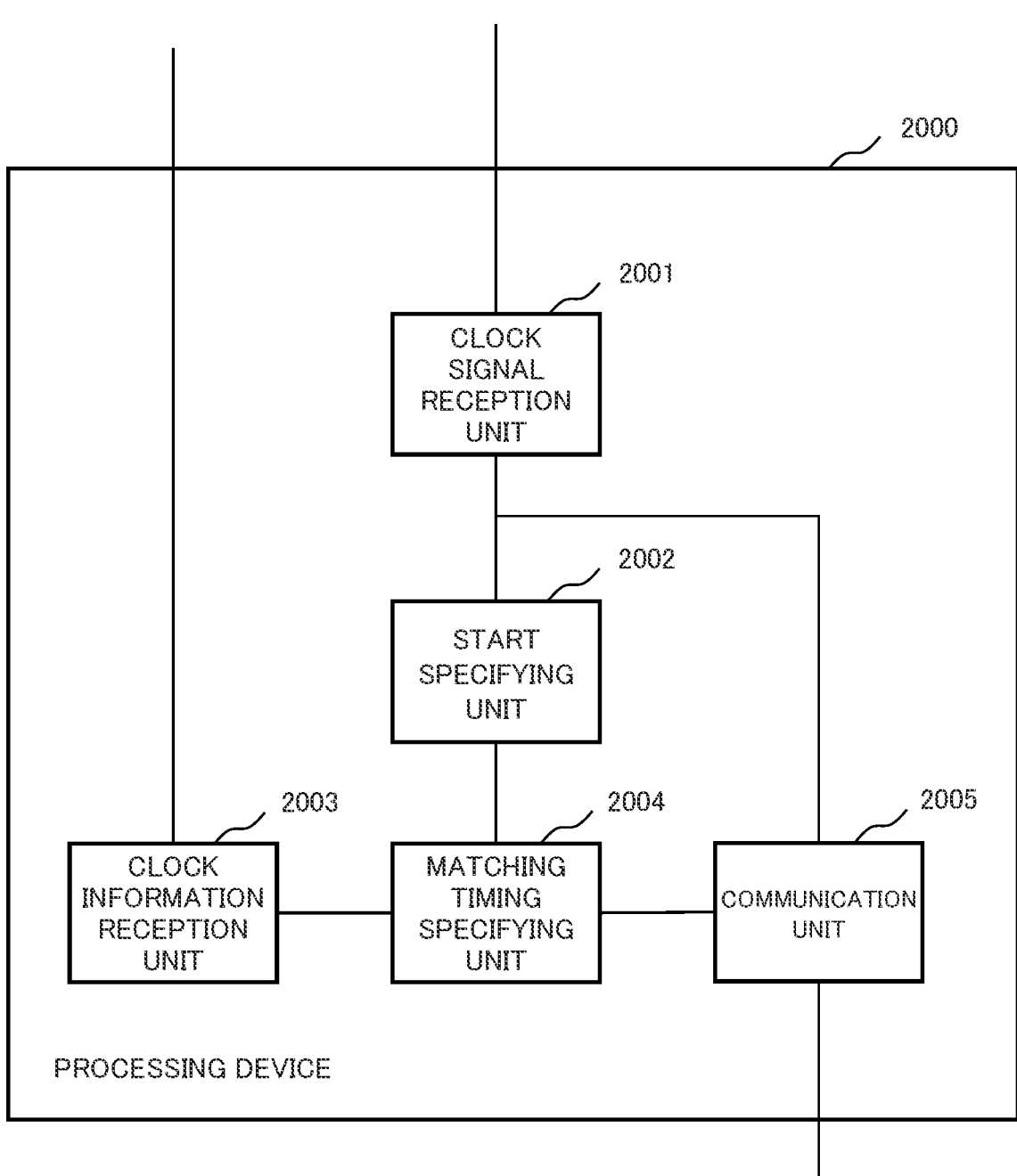
FIG. 16 is a diagram illustrating an example of a configuration of a processing device according to the schematic example of the second example embodiment of the present disclosure.

FIG. 16 is a diagram illustrating an example of a configuration of the processing device 2000 according to the schematic example of the second example embodiment of the present disclosure. In the example illustrated in FIG. 16, the processing device 2000 includes a clock signal reception unit 2001, a start specifying unit 2002, a clock information reception unit 2003, a matching timing specifying unit 2004, and a communication unit 2005. The clock signal reception unit 2001 is associated to the signal line through which the clock A of the circuit A is input and the signal line through which the clock B of the circuit B is input according to the second example embodiment. The start specifying unit 2002 and the matching timing specifying unit 2004 correspond to the communication control circuit 20a of the circuit A and the communication control circuit 20b of the circuit B of the second example embodiment. The clock information reception unit 2003 is associated to the signal line through which the frequency division ratio setting 30a and the frequency division ratio setting 30b of the circuit A are input and the signal line through which the frequency division ratio setting 30a and the frequency division ratio setting 30b of the circuit B are input according to the second example embodiment.

The clock signal reception unit 2001 receives the output clock signal output from the clock signal frequency divider 1010. Specifically, the clock signal reception unit 2001 of the processing device 2000A receives the first output clock signal output from the clock signal frequency divider 1010A. The clock signal reception unit 2001 of the processing device 2000B receives the second output clock signal output from the clock signal frequency divider 1010B.

The clock information reception unit 2003 receives information regarding the frequency division ratio of the output clock signal received by the clock signal reception unit 2001 and information regarding the frequency division ratio of the output clock signal received by the clock signal reception unit 2001 of the processing device 2000 as a communication counterpart. The information regarding the frequency division ratio includes information regarding the mask pulse number.

The start specifying unit 2002 specifies the start clock timing in the received first output clock signal from information regarding the marker portion in a case where the mask pulse number is the mask pulse number of the received output clock signal. The start specifying unit 2002 may hold in advance the information regarding the marker portion in a case where the mask pulse number is the mask pulse number of the received output clock signal. The clock information reception unit 2003 may further receive the information regarding the marker portion. The start specifying unit 2002 of the processing device 2000A specifies the start clock timing in the received first output clock signal from the information regarding the marker portion in a case where the mask pulse number is the mask pulse number of the first output clock signal. The start specifying unit 2002 of the processing device 2000A specifies the start clock timing in the received second output clock signal from the information regarding the marker portion in a case where the mask pulse number is the mask pulse number of the second output clock signal.

The matching timing specifying unit 2004 specifies a matching timing from the start clock timing, information regarding the first output clock signal, and information regarding the second output clock signal. The matching timing is a timing at which a timing of an unmasked pulse of the first output clock signal matches a pulse of the second output clock signal. The information regarding the first output clock signal is information regarding a pattern of a timing of the unmasked pulse of the output clock signal (that is, the first output clock signal) in a case where the mask pulse number is the mask pulse number of the first output clock signal. The information regarding the second output clock signal is information regarding a pattern of a timing of the unmasked pulse of the output clock signal (that is, the second output clock signal) in a case where the mask pulse number is the mask pulse number of the second output clock signal. The matching timing specifying unit 2004 may hold information regarding output clock signals of various frequency division ratios (that is, information regarding the pattern of the timing of the unmasked pulse). The information regarding the first output clock signal and the information regarding the second output clock signal may be input to the clock information reception unit 2003. Then, the clock information reception unit 2003 may receive the information regarding the first output clock signal and the information regarding the second output clock signal.

The communication unit 2005 communicates with the processing device as the communication counterpart at the specified matching timing. Specifically, the communication unit 2005 of the processing device 2000A communicates with the processing device 2000B to which the second output clock signal is supplied at the specified matching timing. The communication unit 2005 of the processing device 2000B communicates with the processing device 2000A to which the first output clock signal is supplied at the specified matching timing.

<Operation>

Next, an operation of the schematic example of the second example embodiment of the present disclosure will be described in detail with reference to the drawings.

Figure 17:
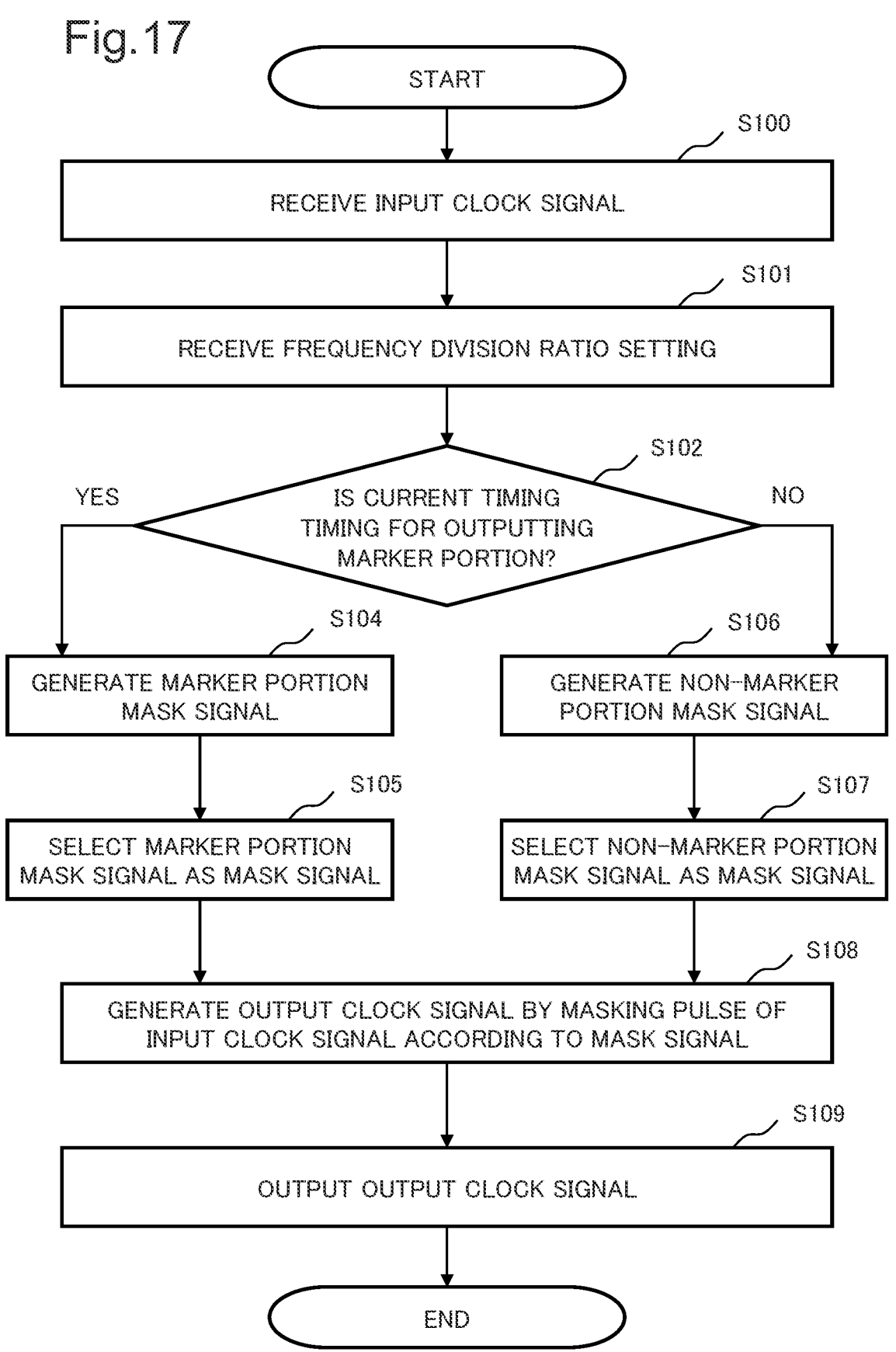
FIG. 17 is a flowchart illustrating an example of an operation of the clock signal frequency divider according to the schematic example of the second example embodiment of the present disclosure.

FIG. 17 is a flowchart illustrating an example of an operation of the clock signal frequency divider 1010 according to the schematic example of the second example embodiment of the present disclosure. At the start of the operation illustrated in FIG. 17, the input clock signal (that is, the clock S) is supplied to the clock signal frequency divider 1010. The clock signal reception unit 1011 receives the input clock signal (step S101). The clock signal frequency divider 1010 is driven by the input clock signal.

In the example illustrated in FIG. 17, next, the setting information reception unit 1012 receives the frequency division ratio setting (step S101).

In a case where the current timing is a timing for outputting the marker portion (YES in step S102), the marker portion mask signal generation unit 1052 of the mask control unit 1051 generates the marker portion mask signal (step S104). Then, the selection unit 1054 of the mask control unit 1051 selects the marker portion mask signal as the mask signal (step S105).

In a case where the current timing is not the timing for outputting the marker portion (NO in step S102), the non-marker portion mask signal generation unit 1053 of the mask control unit 1051 generates the non-marker portion mask signal (step S106). Then, the selection unit 1054 of the mask control unit 1051 selects the non-marker portion mask signal as the mask signal (step S107).

Then, the mask unit 1061 generates the output clock signal by masking the pulse of the input clock signal according to the mask signal (step S108). Then, the output unit 1014 outputs the output clock signal (step S109).

Third Example Embodiment

Hereinafter, a third example embodiment of the present disclosure will be described in detail with reference to the drawings. The present example embodiment corresponds to the processing device 2000 in the schematic example of the second example embodiment.

FIG. 16 is a block diagram illustrating an example of a configuration of a processing device 2000 according to the third example embodiment of the present disclosure. In the example illustrated in FIG. 16, the processing device 2000 includes a clock signal reception unit 2001, a start specifying unit 2002, a clock information reception unit 2003, a matching timing specifying unit 2004, and a communication unit 2005. Each of the clock signal reception unit 2001, the start specifying unit 2002, the clock information reception unit 2003, the matching timing specifying unit 2004, and the communication unit 2005 is the same as each element assigned with the same name and the same reference numeral of the processing device 2000 in the schematic example of the second example embodiment. Each of the clock signal reception unit 2001, the start specifying unit 2002, the clock information reception unit 2003, the matching timing specifying unit 2004, and the communication unit 2005 performs the same operation as the operation of each element assigned with the same name and the same reference numeral of the processing device 2000 in the schematic example of the second example embodiment.

The clock signal reception unit 2001 receives a first clock signal which is a clock signal in which a periodic pattern signal is repeated. The periodic pattern signal is a signal in which predetermined pulses of the mask pulse number smaller than the periodic pulse number among consecutive pulses of a predetermined periodic pulse number are masked. Then, the periodic pattern signal includes a marker portion including at least one unmasked pulse at a start portion of the periodic pattern signal. The clock signal is a clock signal in which a pattern of a timing of the at least one unmasked pulse of the marker portion does not appear in a portion other than a portion matching the marker portion in the clock signal.

The start specifying unit 2002 specifies a start clock timing from information regarding the marker portion in a case where the mask pulse number is the mask pulse number of the first clock signal. The start clock timing is the first timing among timings at which the pulses are output as the clock signals in a case where the pulses are not masked in the marker portion of the received first clock signal.

The clock information reception unit 2003 receives information (hereinafter, also referred to as clock information) regarding the mask pulse number of a second clock signal which is the clock signal whose mask pulse number is different from the mask pulse number of the first clock signal.

The matching timing specifying unit 2004 specifies a matching timing from the start clock timing, information regarding the first clock signal, and information regarding the second clock signal. The information regarding the first clock signal is a pattern of a timing of the unmasked pulse in the first clock signal. The information regarding the second clock signal is a pattern of a timing of the unmasked pulse of the clock signal in a case where the mask pulse number is the mask pulse number of the second clock signal. The matching timing is a timing at which the timing of the unmasked pulse of the first clock signal matches the pulse of the second clock signal.

The communication unit 2005 communicates with a second information processing device to which the second clock signal is supplied at the specified matching timing.

<Operation>

Next, an operation of the processing device 2000 according to the third example embodiment of the present disclosure will be described in detail with reference to the drawings.

Figure 18:
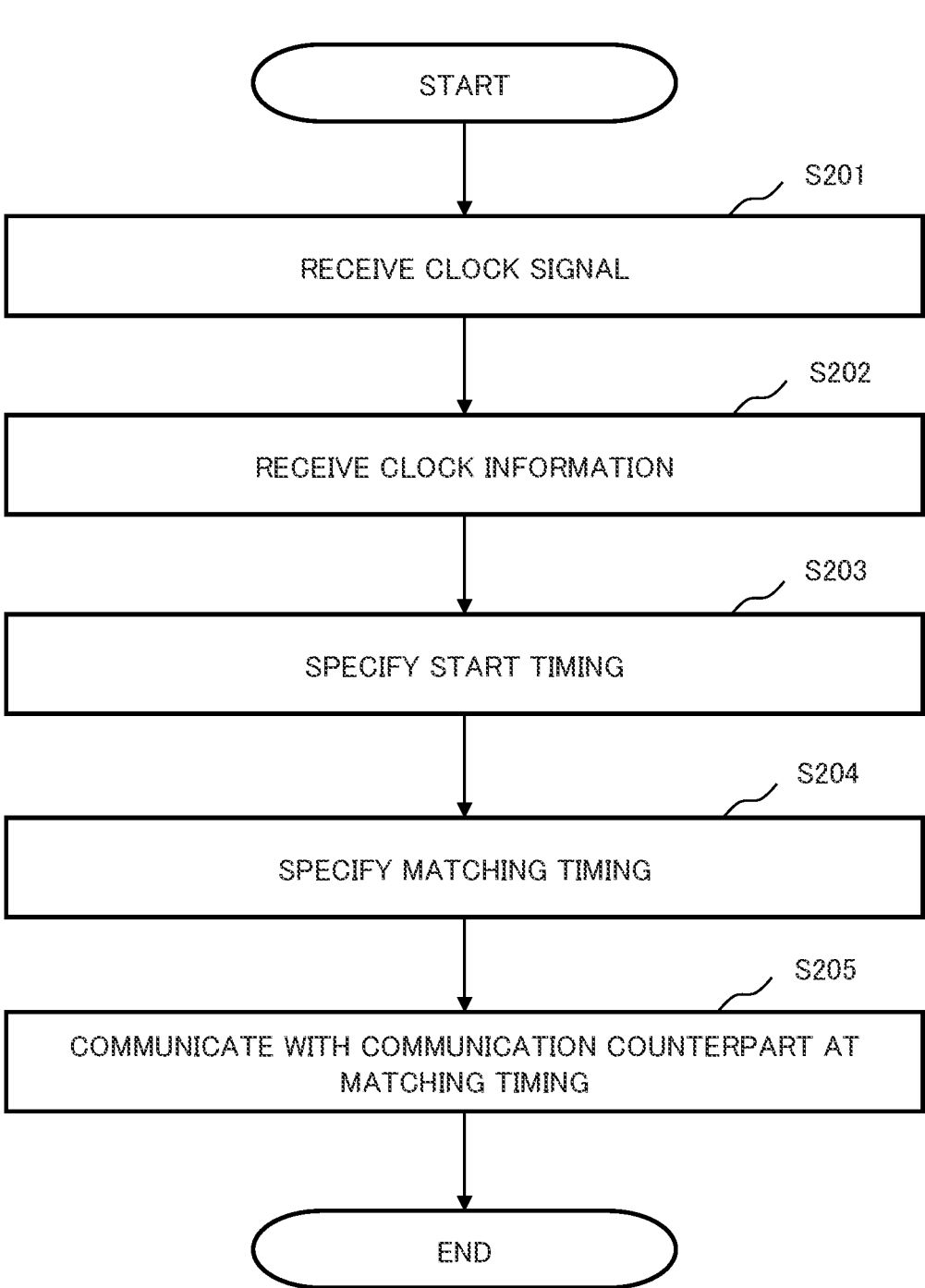
FIG. 18 is a flowchart illustrating an example of an operation of a processing device according to a third example embodiment of the present disclosure.

FIG. 18 is a flowchart illustrating an example of the operation of the processing device 2000 according to the third example embodiment of the present disclosure.

In the example illustrated in FIG. 18, the clock signal reception unit 2001 receives the clock signal (step S201). Next, the clock information reception unit 2003 receives the clock information (step S202). Next, the start specifying unit 2002 specifies the start timing (step S203). Next, the matching timing specifying unit 2004 specifies the matching timing (step S204). Then, the communication unit 2005 communicates with a communication counterpart at the matching timing (step S205).

<Effects>

An effect of reducing the costs and facilitating the timing design can be obtained. This is because the start specifying unit 2002 specifies the start of the periodic pattern by the marker portion in the clock signal in which the periodic pattern signal including the marker portion at the start portion is repeated. This is also because the matching timing specifying unit 2004 specifies the above-described matching timing. Further, this is because the communication unit 2005 communicates with a communication counterpart at the specified matching timing.

In a case where a circuit operating with a first clock signal subjected to rational number frequency division at a certain frequency division ratio communicates with a communication counterpart circuit operating with a second clock signal subjected to rational number frequency division at a different frequency division ratio, it is generally necessary to supply communication timing information to the circuits as described above. The communication timing information is information indicating a timing at which two circuits can communicate with each other. Even in a case where these two circuits are given information of patterns of clock pulses of the first clock signal and the second clock signal, it is generally not possible to specify where the start of a portion associated to a period in which a phase relationship between clocks of the two clock signals completes one cycle is positioned. Therefore, it is not possible to specify which timing is a timing at which there are clock pulses in both of the two clock signals. Therefore, in order for these two circuits to perform communication, it is necessary to supply the communication timing information to the circuits.

However, in order to supply the communication timing information to the circuits, as described above, the timing design becomes difficult, and the costs also increase. However, the circuits as described above can specify the start of the portion associated to the period in which the phase relationship between the clocks of two clock signals completes one cycle by generating the output clock signal in which the periodic pattern signal including the marker portion at the start portion is repeated as in the present example embodiment. Therefore, it is not necessary to supply the communication timing information to the circuits. Therefore, the timing design for supplying the communication timing information to the circuits is not necessary. Therefore, the timing design can be facilitated. Furthermore, the cost for timing design for supplying the communication timing information to the circuits is not required, and the costs can be reduced.

Other Example Embodiments

Each of the processing system 1001, the clock signal frequency divider 1010A, the clock signal frequency divider 1010B, the processing device 2000A, and the processing device 2000B can be implemented by dedicated hardware such as a circuit.

Some or all of the clock signal reception unit 1011, the setting information reception unit 1012, the output signal generation unit 1013, and the output unit 1014 can be implemented by a dedicated circuit that implements the functions of the units. Some or all of the mask control unit 1051, the mask unit 1061, the marker portion mask signal generation unit 1052, the non-marker portion mask signal generation unit 1053, and the selection unit 1054 can be implemented by a dedicated circuit that implements the functions of the units. Some or all of the clock signal reception unit 2001, the start specifying unit 2002, the clock information reception unit 2003, the matching timing specifying unit 2004, and the communication unit 2005 can be implemented by a dedicated circuit that implements the functions of the units.

As described above, in the technologies of JP 2005-45507 A and JP 2006-148807 A, a special timing design and a special clock transfer circuit are required.

In the clock signal frequency dividing circuit described in WO 2009/116398 A1, a clock pulse of an input clock signal is output as an output clock signal without being masked at a communication timing of a target circuit. Therefore, data communication can be performed between a circuit operating according to the input clock signal and a counterpart circuit operating with a clock signal different from the input clock signal without deteriorating communication performance. However, the target circuit needs to recognize the communication timing in order to perform data communication without deteriorating communication performance. Therefore, it is necessary to propagate communication timing information from the clock signal frequency dividing circuit to the target circuit. However, it is necessary to match timings of distribution of the clock signal and distribution of the communication timing information. Therefore, the technology of WO 2009/116398 A1 has a problem that timing design becomes difficult.

The present disclosure has an effect of reducing the costs and facilitating the timing design.

Some or all of the above-described example embodiments can also be described as the following Supplementary Notes, but are not limited thereto.

(Supplementary Note 1)

A clock signal frequency divider including:

output signal generation means that generates, from pulses of a received input clock signal, an output clock signal in which a periodic pattern signal in which pulses of the mask pulse number smaller than the periodic pulse number among consecutive pulses of the periodic pulse number are masked and which includes a marker portion including at least one unmasked pulse at a start portion of the periodic pattern signal is repeated; and output means that outputs the output clock signal, in which the output signal generation means generates the periodic pattern signal in such a way that a pattern of a timing of the at least one unmasked pulse of the marker portion does not appear in a portion other than a portion matching the marker portion in the output clock signal.

(Supplementary Note 2)

The clock signal frequency divider according to Supplementary Note 1, in which the output signal generation means includes:

mask control means that determines whether to mask each of the pulses of the input clock signal from the periodic pulse number and the unmasked pulse number which is the number of pulses that are not masked, and generates a mask signal indicating a result of the determination; and mask means that masks the pulse determined to be masked and outputs the pulse that is not determined to be masked as it is according to the mask signal.

(Supplementary Note 3)

The clock signal frequency divider according to Supplementary Note 2, in which the mask control means includes:

marker portion mask signal generation means that generates a marker portion mask signal which is the mask signal of the marker determined from the periodic pulse number and the unmasked pulse number;

non-marker portion mask signal generation means that generates a non-marker portion mask signal which is the mask signal of a non-marker portion which is a portion other than the marker portion of the periodic pattern signal in such a way that a pattern of an unmasked pulse of the non-marker portion becomes the same as a pattern of an unmasked pulse of a periodic clock signal in a case where rational number frequency division is performed according to a predetermined rational number frequency division algorithm with a frequency division ratio determined from a second periodic pulse number obtained by subtracting the number of pulses of the marker portion from the periodic pulse number and a second unmasked pulse number obtained by subtracting the unmasked pulse number included in the marker portion from the unmasked pulse number; and mask signal selection means that outputs the marker portion mask signal as the mask signal while outputting the marker portion of the periodic pattern signal, and outputs the non-marker portion mask signal as the mask signal while outputting the non-marker portion of the periodic pattern signal.

(Supplementary Note 4)

The clock signal frequency divider according to Supplementary Note 1 or 2, in which in a case where the output pulse number obtained by subtracting the mask pulse number from the periodic pulse number is a value obtained by subtracting 1 from the periodic pulse number, and in a case where the output pulse number is two or more and the output pulse number is smaller than a value obtained by dividing the periodic pulse number by 2, the marker portion includes the unmasked pulses at two consecutive output clock timings that are timings at which the pulses are output as the output clock signals in a case where the pulses are not masked, and a non-marker portion which is a portion other than the marker portion of the periodic pattern signal does not include the unmasked pulses at two consecutive output clock timings, and in a case where the output pulse number is equal to or larger than a value obtained by dividing the periodic pulse number by 2 and the output pulse number is smaller than a value obtained by subtracting 1 from the periodic pulse number and in a case where the output pulse number is one, the pulses at at least two consecutive output clock timings are masked in the marker portion, and the pulses at two consecutive output clock timings are not masked in the non-marker portion.

(Supplementary Note 5)

A processing system including:

a first clock signal frequency divider and a second clock signal frequency divider each of which is the clock signal frequency divider according to Supplementary Note 1 or 2; and a processing device, in which the output means of the first clock signal frequency divider outputs a first output clock signal which is the output clock signal, the output means of the second clock signal frequency divider outputs a second output clock signal which is the output clock signal whose mask pulse number is different from the mask pulse number of the first output clock signal, a start clock timing, which is a first timing among timings at which the pulses are output as the output clock signals in a case where the pulses are not masked, of the marker portion of the first output clock signal is the same as the start clock timing of the marker portion of the second output clock signal, and the processing device includes:

clock signal reception means that receives the first output clock signal;

start specifying means that specifies the start clock timing in the received first output clock signal from information regarding the marker portion in a case where the mask pulse number is the mask pulse number of the first output clock signal;

clock information reception means that receives information regarding the mask pulse number of the second output clock signal;

matching timing specifying means that specifies a matching timing at which the timing of the unmasked pulse of the first output clock signal and the pulse of the second output clock signal match each other, from the start clock timing, a pattern of the timing of the unmasked pulse of the first output clock signal, and a pattern of the timing of the unmasked pulse of the output clock signal in a case where the mask pulse number is the mask pulse number of the second output clock signal; and communication means that communicates with a second processing device to which the second output clock signal is supplied at the specified matching timing.

(Supplementary Note 6)

A processing device including:

clock signal reception means that receives a first clock signal, the first clock signal being a clock signal in which a periodic pattern signal in which predetermined pulses of the mask pulse number smaller than a predetermined periodic pulse number among consecutive pulses of the periodic pulse number are masked and which includes a marker portion including at least one unmasked pulse at a start portion of the periodic pattern signal is repeated, and being a clock signal in which a pattern of a timing of the at least one unmasked pulse of the marker portion does not appear in a portion other than a portion matching the marker portion in the clock signal;

start specifying means that specifies a start clock timing, which is a first timing among timings at which the pulses are output as the clock signals in a case where the pulses are not masked, of the marker portion of the received first clock signal from information regarding the marker portion in a case where the mask pulse number is the mask pulse number of the first clock signal;

clock information reception means that receives information regarding the mask pulse number of a second clock signal which is the clock signal whose mask pulse number is different from the mask pulse number of the first clock signal;

matching timing specifying means that specifies a matching timing at which the timing of the unmasked pulse of the first clock signal and the pulse of the second clock signal match each other from the start clock timing, a pattern of the timing of the unmasked pulse of the first clock signal, and a pattern of the timing of the unmasked pulse of the clock signal in a case where the mask pulse number is the mask pulse number of the second clock signal; and communication means that communicates with a second information processing device to which the second clock signal is supplied at the specified matching timing.

(Supplementary Note 7)

A clock signal frequency dividing method including:

generating, from pulses of a received input clock signal, an output clock signal in which a periodic pattern signal in which pulses of the mask pulse number smaller than the periodic pulse number among consecutive pulses of the periodic pulse number are masked and which includes a marker portion including at least one unmasked pulse at a start portion of the periodic pattern signal is repeated; and outputting the output clock signal, in which in the generating of the output clock signal, the periodic pattern signal is generated in such a way that a pattern of a timing of the at least one unmasked pulse of the marker portion does not appear in a portion other than a portion matching the marker portion in the output clock signal.

(Supplementary Note 8)

The clock signal frequency dividing method according to Supplementary Note 7, further including:

determining whether to mask each of the pulses of the input clock signal from the periodic pulse number and the unmasked pulse number which is the number of pulses that are not masked, and generating a mask signal indicating a result of the determination; and masking the pulse determined to be masked and outputting the pulse that is not determined to be masked as it is according to the mask signal.

(Supplementary Note 9)

The clock signal frequency dividing method according to Supplementary Note 8, further including:

generating a marker portion mask signal which is the mask signal of the marker determined from the periodic pulse number and the unmasked pulse number;

generating a non-marker portion mask signal which is the mask signal of a non-marker portion which is a portion other than the marker portion of the periodic pattern signal in such a way that a pattern of an unmasked pulse of the non-marker portion becomes the same as a pattern of an unmasked pulse of a periodic clock signal in a case where rational number frequency division is performed according to a predetermined rational number frequency division algorithm with a frequency division ratio determined from a second periodic pulse number obtained by subtracting the number of pulses of the marker portion from the periodic pulse number and a second unmasked pulse number obtained by subtracting the unmasked pulse number included in the marker portion from the unmasked pulse number; and outputting the marker portion mask signal as the mask signal while outputting the marker portion of the periodic pattern signal, and outputting the non-marker portion mask signal as the mask signal while outputting the non-marker portion of the periodic pattern signal.

(Supplementary Note 10)

The clock signal frequency dividing method according to Supplementary Note 7 or 8, in which in a case where the output pulse number obtained by subtracting the mask pulse number from the periodic pulse number is a value obtained by subtracting 1 from the periodic pulse number, and in a case where the output pulse number is two or more and the output pulse number is smaller than a value obtained by dividing the periodic pulse number by 2, the marker portion includes the unmasked pulses at two consecutive output clock timings that are timings at which the pulses are output as the output clock signals in a case where the pulses are not masked, and a non-marker portion which is a portion other than the marker portion of the periodic pattern signal does not include the unmasked pulses at two consecutive output clock timings, and in a case where the output pulse number is equal to or larger than a value obtained by dividing the periodic pulse number by 2 and the output pulse number is smaller than a value obtained by subtracting 1 from the periodic pulse number and in a case where the output pulse number is one, the pulses at at least two consecutive output clock timings are masked in the marker portion, and the pulses at two consecutive output clock timings are not masked in the non-marker portion.

(Supplementary Note 11)

A processing system control method using the clock signal frequency dividing method according to Supplementary Note 7 or 8, the processing system control method including:

outputting a first output clock signal which is the output clock signal; and outputting a second output clock signal which is the output clock signal whose mask pulse number is different from the mask pulse number of the first output clock signal, in which a start clock timing, which is a first timing among timings at which the pulses are output as the output clock signals in a case where the pulses are not masked, of the marker portion of the first output clock signal is the same as the start clock timing of the marker portion of the second output clock signal, a processing device receives the first output clock signal, specifies the start clock timing in the received first output clock signal from information regarding the marker portion in a case where the mask pulse number is the mask pulse number of the first output clock signal, receives information regarding the mask pulse number of the second output clock signal, specifies a matching timing at which the timing of the unmasked pulse of the first output clock signal and the pulse of the second output clock signal match each other, from the start clock timing, a pattern of the timing of the unmasked pulse of the first output clock signal, and a pattern of the timing of the unmasked pulse of the output clock signal in a case where the mask pulse number is the mask pulse number of the second output clock signal, and communicates with a second processing device to which the second output clock signal is supplied at the specified matching timing.

(Supplementary Note 12)

A processing method including:

receiving a first clock signal, the first clock signal being a clock signal in which a periodic pattern signal in which predetermined pulses of the mask pulse number smaller than a predetermined periodic pulse number among consecutive pulses of the periodic pulse number are masked and which includes a marker portion including at least one unmasked pulse at a start portion of the periodic pattern signal is repeated, and being a clock signal in which a pattern of a timing of the at least one unmasked pulse of the marker portion does not appear in a portion other than a portion matching the marker portion in the clock signal;

specifying a start clock timing, which is a first timing among timings at which the pulses are output as the clock signals in a case where the pulses are not masked, of the marker portion of the received first clock signal from information regarding the marker portion in a case where the mask pulse number is the mask pulse number of the first clock signal;

receiving information regarding the mask pulse number of a second clock signal which is the clock signal whose mask pulse number is different from the mask pulse number of the first clock signal;

specifying a matching timing at which the timing of the unmasked pulse of the first clock signal and the pulse of the second clock signal match each other from the start clock timing, a pattern of the timing of the unmasked pulse of the first clock signal, and a pattern of the timing of the unmasked pulse of the clock signal in a case where the mask pulse number is the mask pulse number of the second clock signal; and communicating with a second information processing device to which the second clock signal is supplied at the specified matching timing.

The previous description of embodiments is provided to enable a person skilled in the art to make and use the present invention. Moreover, various modifications to these example embodiments will be readily apparent to those skilled in the art, and the generic principles and specific examples defined herein may be applied to other embodiments without the use of inventive faculty. Therefore, the present invention is not intended to be limited to the example embodiments described herein but is to be accorded the widest scope as defined by the limitations of the claims and equivalents.

Further, it is noted that the inventor's intent is to retain all equivalents of the claimed invention even if the claims are amended during prosecution.

What is claimed is:

1. A clock signal frequency divider comprising:

an output signal generation circuit configured to generate, from pulses of a received input clock signal, an output clock signal including a repetition of a periodic pattern signal in which a pulse of a mask pulse number is masked among consecutive pulses of a periodic pulse number, the periodic pattern signal including a marker portion including at least one unmasked pulse at a start portion of the periodic pattern signal, the mask pulse number being smaller than the periodic pulse number; and an output circuit configured to output the output clock signal, wherein the output signal generation circuit generates the periodic pattern signal in such a way that a pattern of a timing of the at least one unmasked pulse of the marker portion does not appear in a portion other than a portion corresponding to the marker portion in the output clock signal.

2. The clock signal frequency divider according to claim 1, wherein the output signal generation circuit comprises:

a mask control circuit configured to: perform determination to mask which of the pulses of the input clock signal based on the periodic pulse number and an unmasked pulse number that is a pulse number of pulses that are not masked; and generate a mask signal indicating a result of the determination; and a mask circuit configured to: according to the mask signal, mask a pulse that is determined to be masked; and output a pulse that is not determined to be masked as it is.

3. The clock signal frequency divider according to claim 2, wherein the mask control circuit comprises:

a marker portion mask signal generation circuit configured to generate a marker portion mask signal which is the mask signal of the marker portion determined based on the periodic pulse number and the unmasked pulse number;

a non-marker portion mask signal generation circuit configured to generate a non-marker portion mask signal in such a way that a pattern of an unmasked pulse of the non-marker portion is same as a pattern of an unmasked pulse of a periodic clock signal generated by performing rational number frequency division according to a predetermined rational number frequency division algorithm with a frequency division ratio determined based on a second periodic pulse number and a second unmasked pulse number, the non-marker portion mask signal being the mask signal of a non-marker portion which is a portion other than the marker portion of the periodic pattern signal, the second periodic pulse number being obtained by subtracting the pulse number of pulses of the marker portion from the periodic pulse number, the second unmasked pulse number being obtained by subtracting the pulse unmasked pulse number included in the marker portion from the unmasked pulse number; and a mask signal selection circuit configured to: output the marker portion mask signal as the mask signal during a time period when outputting the marker portion of the periodic pattern signal; and output the non-marker portion mask signal as the mask signal during a time period when outputting the non-marker portion of the periodic pattern signal.

4. The clock signal frequency divider according to claim 1, wherein in a case where an output pulse number obtained by subtracting the mask pulse number from the periodic pulse number is a value obtained by subtracting one from the periodic pulse number, and in a case where the output pulse number is equal to or larger than two and the output pulse number is smaller than a value obtained by dividing the periodic pulse number by two, the marker portion includes the unmasked pulse at two consecutive output clock timings that are timings at which the pulses are output as the output clock signals in a case where the pulses are not masked, and a non-marker portion does not include the unmasked pulse at two consecutive output clock timings, the non-marker portion being a portion other than the marker portion in the periodic pattern signal, and in a case where the output pulse number is equal to or larger than a value obtained by dividing the periodic pulse number by two and the output pulse number is smaller than a value obtained by subtracting one from the periodic pulse number and in a case where the output pulse number is one, the pulses at least two consecutive output clock timings are masked in the marker portion, and the pulses at two consecutive output clock timings are not masked in the non-marker portion.

5. A processing system including a first clock signal frequency divider and a second clock signal frequency divider each of which is the clock signal frequency divider according to claim 1, the processing system comprising:

a processing device, wherein the output circuit of the first clock signal frequency divider outputs a first output clock signal which is the output clock signal, the output circuit of the second clock signal frequency divider outputs a second output clock signal which is the output clock signal whose mask pulse number is different from the mask pulse number of the first output clock signal, a start clock timing of the marker portion of the first output clock signal is same as the start clock timing of the marker portion of the second output clock signal, the start clock timing being a first timing among timings at which the pulse is output as the output clock signal in a case where the pulse is not masked, and the processing device comprises:

a clock signal reception circuit configured to receive the first output clock signal;

a start specifying circuit configured to specify the start clock timing in the received first output clock signal from information regarding the marker portion in a case where the mask pulse number is the mask pulse number of the first output clock signal;

a clock information reception circuit configured to receive information regarding the mask pulse number of the second output clock signal;

a matching timing specifying circuit configured to specify a matching timing at which a timing of the unmasked pulse of the first output clock signal and a timing of the unmasked pulse of the second output clock signal match each other, from the start clock timing, a pattern of the timing of the unmasked pulse of the first output clock signal, and a pattern of the timing of the unmasked pulse of the output clock signal in a case where the mask pulse number is the mask pulse number of the second output clock signal; and a communication circuit configured to communicate, at the specified matching timing, with a second processing device to which the second output clock signal is supplied.

6. A processing device comprising:

a clock signal reception circuit configured to receive a first clock signal, the first clock signal being a clock signal including a repetition of a periodic pattern signal in which a predetermined pulse of a mask pulse number is masked among consecutive pulses of a periodic pulse number the periodic pattern signal including a marker portion including at least one unmasked pulse at a start portion of the periodic pattern signal, the mask pulse number being smaller than the periodic pulse number, the periodic pattern signal being a clock signal in which a pattern of a timing of the at least one unmasked pulse of the marker portion does not appear in a portion other than a portion corresponding to the marker portion in the clock signal;

a start specifying circuit configured to specify a start clock timing of the marker portion of the received first clock signal based on information regarding the marker portion in a case where the mask pulse number is equal to the mask pulse number of the first clock signal, the start clock timing being a first timing among timings at which the pulses are output as the clock signals in a case where the pulses are not masked;

a clock information reception circuit configured to receive information regarding the mask pulse number of a second clock signal which is the clock signal whose mask pulse number is different from the mask pulse number of the first clock signal;

a matching timing specifying circuit configured to specify a matching timing at which a timing of the unmasked pulse of the first clock signal and a timing of the unmasked pulse of the second clock signal match each other from the start clock timing, a pattern of the timing of the unmasked pulse of the first clock signal, and a pattern of the timing of the unmasked pulse of the clock signal in a case where the mask pulse number is equal to the mask pulse number of the second clock signal; and a communication circuit configured to communicate, at the specified matching timing, with a second information processing device to which the second clock signal is supplied.

7. A clock signal frequency dividing method comprising:

generating, from pulses of a received input clock signal, an output clock signal including a repetition of a periodic pattern signal in which a pulse of a mask pulse number is masked among consecutive pulses of a periodic pulse number, the periodic pattern signal including a marker portion including at least one unmasked pulse at a start portion of the periodic pattern signal, the mask pulse number being smaller than the periodic pulse number; and outputting the output clock signal, wherein in the generating of the output clock signal, the periodic pattern signal is generated in such a way that a pattern of a timing of the at least one unmasked pulse of the marker portion does not appear in a portion other than a portion corresponding to the marker portion in the output clock signal.

8. The clock signal frequency dividing method according to claim 7, further comprising:

performing determination to mask which of the pulses of the input clock signal based on the periodic pulse number and an unmasked pulse number that is a pulse number of pulses that are not masked, and generating a mask signal indicating a result of the determination; and according to the mask signal, masking a pulse that is determined to be masked, and outputting a pulse that is not determined to be masked as it is.

9. The clock signal frequency dividing method according to claim 8, further comprising:

generating a marker portion mask signal which is the mask signal of the marker portion determined based on the periodic pulse number and the unmasked pulse number;

generating a non-marker portion mask signal in such a way that a pattern of an unmasked pulse of the non-marker portion is same as a pattern of an unmasked pulse of a periodic clock signal generated by performing rational number frequency division according to a predetermined rational number frequency division algorithm with a frequency division ratio determined based on a periodic pulse second number and a second unmasked pulse number, the non-marker portion mask signal being the mask signal of a non-marker portion which is a portion other than the marker portion of the periodic pattern signal, the second periodic pulse number being obtained by subtracting the pulse number of pulses of the marker portion from the periodic pulse number, and the second unmasked pulse number being obtained by subtracting the pulse unmasked pulse number included in the marker portion from the unmasked pulse number; and outputting the marker portion mask signal as the mask signal during a time period when outputting the marker portion of the periodic pattern signal, and outputting the non-marker portion mask signal as the mask signal during a time period outputting the non-marker portion of the periodic pattern signal.

10. The clock signal frequency dividing method according to claim 7, wherein in a case where an output pulse number obtained by subtracting the mask pulse number from the periodic pulse number is a value obtained by subtracting one from the periodic pulse number, and in a case where the output pulse number is equal to or larger than two and the output pulse number is smaller than a value obtained by dividing the periodic pulse number by two, the marker portion includes the unmasked pulse at two consecutive output clock timings that are timings at which the pulses are output as the output clock signals in a case where the pulses are not masked, and a non-marker portion does not include the unmasked pulses at two consecutive output clock timings, the non-marker portion being a portion other than the marker portion in the periodic pattern signal, and in a case where the output pulse number is equal to or larger than a value obtained by dividing the periodic pulse number by two and the output pulse number is smaller than a value obtained by subtracting one from the number periodic pulse and in a case where the output pulse number is one, the pulses at least two consecutive output clock timings are masked in the marker portion, and the pulses at two consecutive output clock timings are not masked in the non-marker portion.

11. A processing system control method using the clock signal frequency dividing method according to claim 7, the processing system control method comprising:

outputting a first output clock signal which is the output clock signal;

outputting a second output clock signal which is the output clock signal whose mask pulse number is different from the number mask pulse of the first output clock signal, a start clock timing of the marker portion of the first output clock signal being same as the start clock timing of the marker portion of the second output clock signal, the start clock timing being a first timing among timings at which the pulse is output as the output clock signal in a case where the pulse is not masked;

receiving the first output clock signal;

specifying the start clock timing in the received first output clock signal from information regarding the marker portion in a case where the mask pulse number is equal to the mask pulse number of the first output clock signal;

receiving information regarding the mask pulse number of the second output clock signal, specifying a matching timing at which a timing of the unmasked pulse of the first output clock signal and a timing of the unmasked pulse of the second output clock signal match each other, from the start clock timing, a pattern of the timing of the unmasked pulse of the first output clock signal, and a pattern of the timing of the unmasked pulse of the output clock signal in a case where the mask pulse number is equal to the mask pulse number of the second output clock signal; and communicating, at the specified matching timing, with a second processing device to which the second output clock signal is supplied.

* * * * *